(12) United States Patent
Yeh et al.

(10) Patent No.: US 12,542,341 B2
(45) Date of Patent: Feb. 3, 2026

(54) ELECTRONIC DEVICE AND METHOD OF MANUFACTURING ELECTRONIC DEVICE

(71) Applicant: Innolux Corporation, Miaoli County (TW)

(72) Inventors: Chen-Lin Yeh, Miaoli County (TW); Yan-Zheng Wu, Miaoli County (TW); Yung-Wei Chen, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 299 days.

(21) Appl. No.: 18/331,946

(22) Filed: Jun. 9, 2023

(65) Prior Publication Data

US 2024/0030580 A1    Jan. 25, 2024

Related U.S. Application Data

(60) Provisional application No. 63/390,289, filed on Jul. 19, 2022.

(30) Foreign Application Priority Data

Mar. 16, 2023    (CN) .......................... 202310256579.7

(51) Int. Cl.
*H01P 3/08*    (2006.01)
*H01P 11/00*    (2006.01)
(Continued)

(52) U.S. Cl.
CPC ............ *H01P 3/081* (2013.01); *H01P 11/003* (2013.01); *H05K 1/0243* (2013.01); *H05K 3/06* (2013.01); *H05K 3/368* (2013.01); *H05K 3/423* (2013.01); *H05K 3/0029* (2013.01); *H05K 3/0052* (2013.01); *H05K 3/0067* (2013.01); *H05K 2201/09545* (2013.01);
(Continued)

(58) Field of Classification Search
None
See application file for complete search history.

(56) References Cited

U.S. PATENT DOCUMENTS

2009/0066597 A1    3/2009  Yang et al.
2009/0079648 A1*   3/2009  Matsuo ................. H01P 5/1007
                                                        343/771

(Continued)

FOREIGN PATENT DOCUMENTS

CN    105244578    1/2016

*Primary Examiner* — Timothy J Thompson
*Assistant Examiner* — John B Freal
(74) *Attorney, Agent, or Firm* — JCIPRNET

(57) ABSTRACT

An electronic device includes a glass substrate, a first metal layer, a second metal layer, and a third metal layer. The glass substrate includes a first surface, a second surface corresponding to the first surface, and at least two first through holes. The first through hole includes a third surface, and the third surface is connected to the first surface and the second surface. A first conductive layer is disposed on the first surface. A second conductive layer is disposed on the second surface. A third conductive layer is disposed on the third surface and is electrically connected to the first conductive layer and the second conductive layer. The first through hole has a major axis and a minor axis in a top view direction. A method of manufacturing the electronic device is also included.

17 Claims, 16 Drawing Sheets

(51) Int. Cl.
*H05K 1/02* (2006.01)
*H05K 3/00* (2006.01)
*H05K 3/06* (2006.01)
*H05K 3/36* (2006.01)
*H05K 3/42* (2006.01)

(52) U.S. Cl.
CPC .............. *H05K 2201/09609* (2013.01); *H05K 2201/09618* (2013.01); *H05K 2201/10098* (2013.01); *H05K 2201/10151* (2013.01); *H05K 2201/10196* (2013.01); *H05K 2203/0723* (2013.01)

(56) References Cited

U.S. PATENT DOCUMENTS

| | | | |
|---|---|---|---|
| 2015/0015453 A1* | 1/2015 | Puzella | ................ H05K 1/0206 333/1.1 |
| 2017/0186710 A1 | 6/2017 | Yoon et al. | |
| 2017/0346169 A1* | 11/2017 | Wang | ....................... H01Q 1/28 |

* cited by examiner

ELECTRONIC DEVICE AND METHOD OF MANUFACTURING ELECTRONIC DEVICE

CROSS-REFERENCE TO RELATED APPLICATION

This application claims the priority benefits of U.S. provisional application Ser. No. 63/390,289, filed on Jul. 19, 2022, and China application serial no. 202310256579.7, filed on Mar. 16, 2023. The entirety of each of the above-mentioned patent applications is hereby incorporated by reference herein and made a part of this specification.

BACKGROUND

Technical Field

The disclosure relates to an electronic device and a method of manufacturing the electronic device, and more particularly, to an electronic device including a waveguide structure and a method of manufacturing the same.

Description of Related Art

A substrate integrated waveguide (SIW) is a waveguide structure commonly used to transmit a high-frequency signal, which includes a dielectric layer, metal layers disposed on two opposite surfaces of the dielectric layer, and multiple through holes penetrating the dielectric layer. The strength of the high-frequency signal will be attenuated by the dielectric loss generated by the dielectric layer, the metal loss generated by the metal layer, and/or the signal leakage between adjacent through holes. In the case of reducing the attenuation of the strength of the high-frequency signal due to the dielectric layer, a dielectric layer with a relatively small dissipation factor is generally selected to form a substrate integrated waveguide. However, since most of the existing substrate integrated waveguides are formed by using printed circuit boards, the material selection of the dielectric layer in the printed circuit boards is limited by the above factors, thereby resulting in an increase in the cost of forming the substrate integrated waveguides.

SUMMARY

The disclosure provides an electronic device and a method of manufacturing the electronic device, in which a cost of the electronic device may be reduced, and the electronic device may have a relatively low signal strength attenuation when applied to transmitting a high-frequency signal.

An electronic device provided according to some embodiments of the disclosure includes a glass substrate, a first metal layer, a second metal layer, and a third metal layer. The glass substrate includes a first surface, a second surface corresponding to the first surface, and at least two first through holes. The first through hole includes a third surface, and the third surface is connected to the first surface and the second surface. A first conductive layer is disposed on the first surface. A second conductive layer is disposed on the second surface. A third conductive layer is disposed on the third surface and is electrically connected to the first conductive layer and the second conductive layer. The first through hole has a major axis and a minor axis in a top view direction.

According to some embodiments of the disclosure, a method of manufacturing an electronic device includes the following steps. A glass substrate is provided, which includes a first surface and a second surface corresponding to the first surface. The glass substrate is patterned to form at least two first through holes. A third surface is formed in the glass substrate by the first through hole, and the third surface is connected to the first surface and the second surface. A first conductive layer is formed on the first surface. A second conductive layer is formed on the second surface. A third conductive layer is formed on the third surface, so that the third conductive layer is electrically connected to the first conductive layer and the second conductive layer. In a top view direction, the first through hole is provided with a major axis and a minor axis.

In order to make the above-mentioned features and advantages of the disclosure clearer and easier to understand, the following embodiments are given and described in details with accompanying drawings as follows.

BRIEF DESCRIPTION OF THE DRAWINGS

The accompanying drawings are included to provide a further understanding of this disclosure, and are incorporated in and constitute a part of this specification. The drawings illustrate the embodiments of the disclosure, and together with the description serve to explain principles of the disclosure.

DESCRIPTION OF THE EMBODIMENTS

Figure 1A:
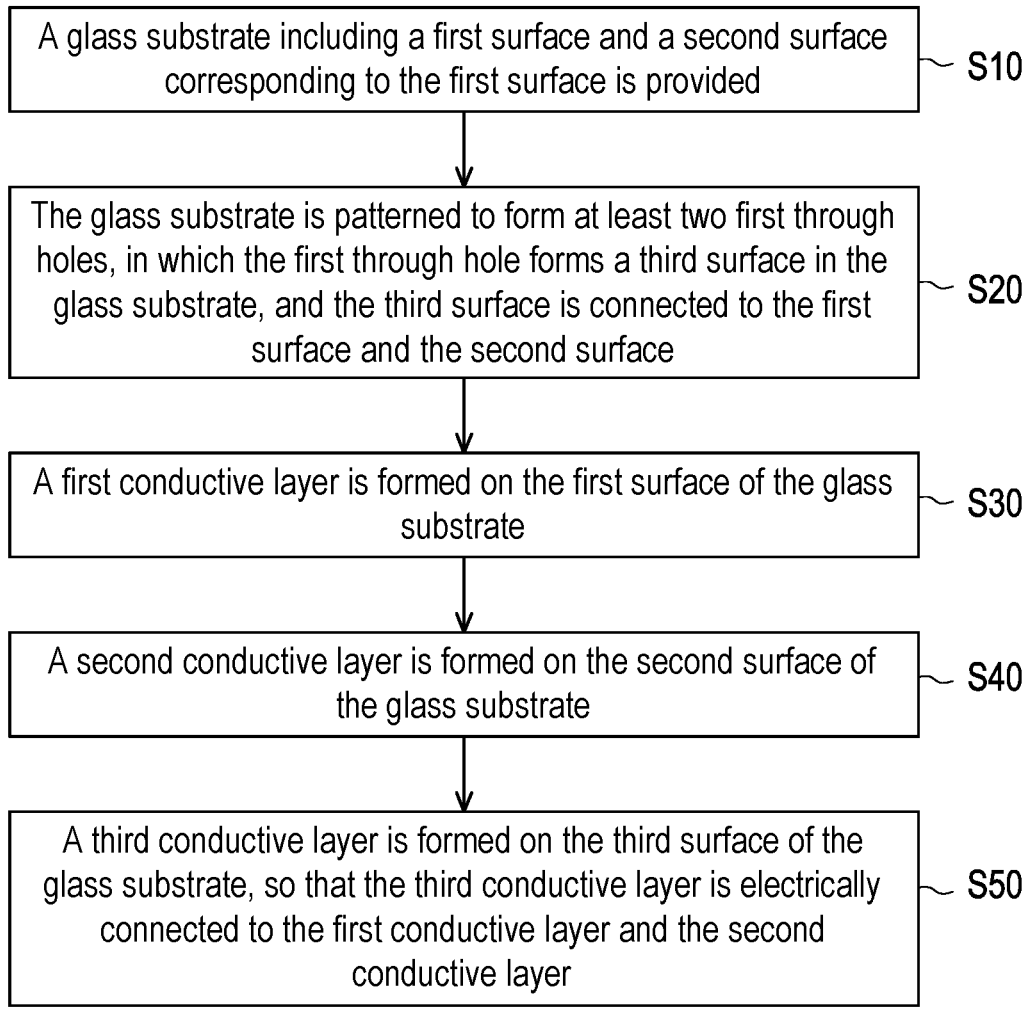
FIG. 1A is a flow chart of a method of manufacturing an electronic device according to an embodiment of the disclosure.

The disclosure can be understood by referring to the following detailed description in combination with the accompanying drawings. It should be noted that in order to make it easy for the reader to understand and for the simplicity of the drawings, the multiple drawings in this disclosure only depict a part of the electronic device, and the specific components in the drawings are not drawn according to actual scale. In addition, the quantity and size of each component in the drawings are only for exemplary purpose, and are not intended to limit the scope of the disclosure.

Throughout the disclosure, certain terms are used to refer to specific elements in the specification and the claims. Those skilled in the art should understand that electronic device manufacturers may refer to the same components by different names. The present specification does not intend to distinguish between components that have the same function but different names. In the following specification and claims, words such as "comprising", "including", and "having" are open-ended words, and thus they should be interpreted as meaning "including but not limited to . . . ". Therefore, when the terms "comprising", "including" and/or "having" are used in the description of the disclosure, the use thereof specifies the existence of corresponding features, regions, steps, operations and/or components, but does not exclude the existence of one or more corresponding features, regions, steps, operations and/or components.

Directional terms, such as "upper", "lower", "front", "rear", "left", "right", mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, these drawings should not be construed to define or limit the scope or nature covered by the embodiments. For example, the relative sizes, thicknesses, and positions of various layers, regions, and/or structures may be reduced or enlarged for clarity.

When a corresponding component (e.g., a film layer or region) is referred to as being "on" another component, it may be directly on the other component or other components may be present therebetween. On the other hand, when a component is referred to as being "directly on" another member, there are no components in between. Additionally, when a component is referred to as being "on" another component, the two are in a top-down relationship when viewed from above, and the component may be above or below the other component, depending on the orientation of the device.

The terms "about", "equal to", "equivalent" or "same", "substantially" or "roughly" are generally interpreted as being within 20% of a given value or range, or interpreted as within 10%, 5%, 3%, 2%, 1%, or 0.5% of a value or range.

The ordinal number used in the specification and the claims such as "first" or "second" is used to modify elements, and the ordinal numbers do not imply and represent that the element(s) have any previous ordinal numbers, nor do they represent the order of a certain element and another element or the order of a manufacturing method. The use of the ordinal numbers is only used to clearly distinguish between an element with a certain name and another element with the same name. The claims and the specification may not use the same terms, whereby a first component in the specification may be a second component in the claims.

It should be noted that, in the following embodiments, the features in several different embodiments may be replaced, reorganized, and mixed to complete other embodiments without departing from the spirit of the disclosure. As long as the features of the various embodiments do not violate the spirit of the disclosure or conflict with one another, they may be mixed and matched arbitrarily.

The electrical connection or coupling described in this disclosure may refer to direct connection or indirect connection. In the case of direct electrical connection, endpoints of elements on two circuits are directly connected or connected to each other by a conductor segment, while in the case of indirect electrical connection, there is a switch, a diode, a capacitor, an inductor, other suitable elements, or a combination thereof between the endpoints of the elements on the two circuits, but not limited thereto.

In this disclosure, the measurement manner of thickness, length, and width may adopt an optical microscope, and the thickness may be measured by a cross-sectional image in an electron microscope, but is not limited thereto. In addition, there may be a certain error between any two values or directions for comparison. If a first value is equal to a second value, it implies that there may be an error of 10% between the first value and the second value. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

An electronic device of the disclosure may include functions such as antenna (such as a liquid crystal antenna), display, lighting, sensing, touching, splicing, other suitable functions, or a combination thereof, but is not limited thereto. The electronic device may be a bendable or flexible electronic device. A display device may include, for example, a liquid crystal, a light emitting diode (LED), a quantum dot (QD), a fluorescence, a phosphor, other suitable materials, or a combination thereof. The light emitting diode may include, for example, an organic light emitting diode (OLED), a micro light emitting diode (micro-LED), or a quantum dot light emitting diode (QLED, QDLED), but is not limited thereto. An electronic component may include a transistor, a circuit board, a chip, a die, an integrated circuit (IC), a combination thereof, or other suitable electronic components, but is not limited thereto.

Exemplary embodiments of this disclosure are exemplified below, the same reference numerals in the drawings and the descriptions indicate the same or similar parts.

Figure 1B:
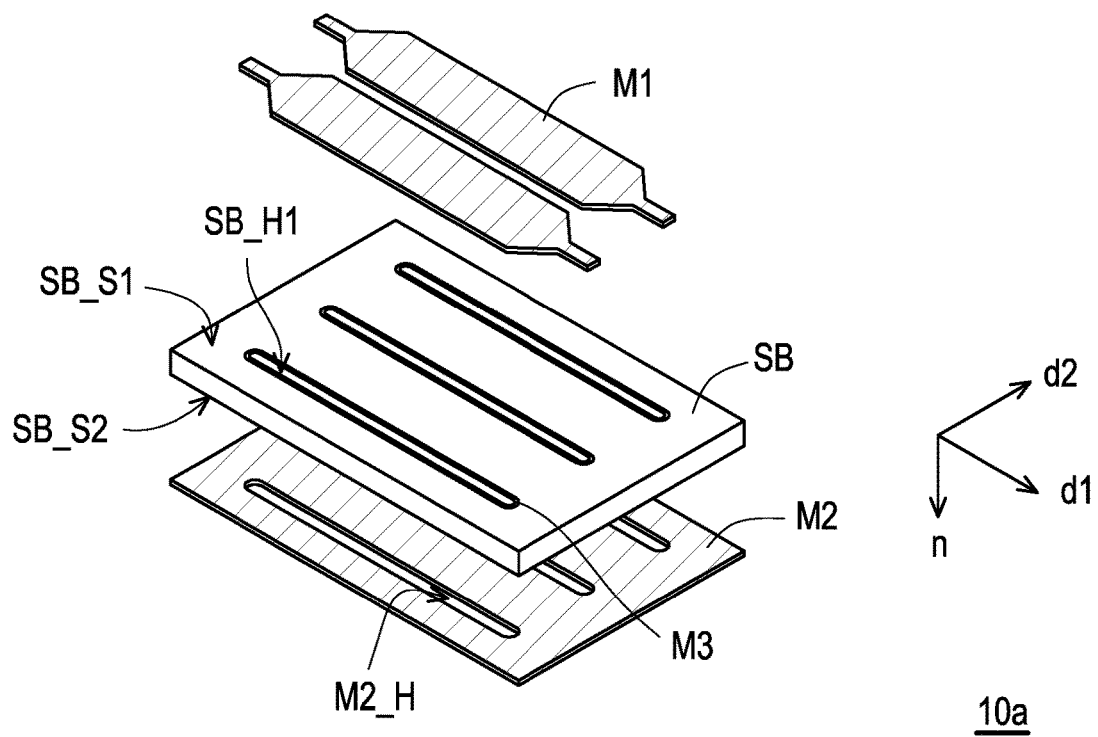
FIG. 1B is a schematic exploded diagram of an electronic device according to a first embodiment of the disclosure.
Figure 1C:
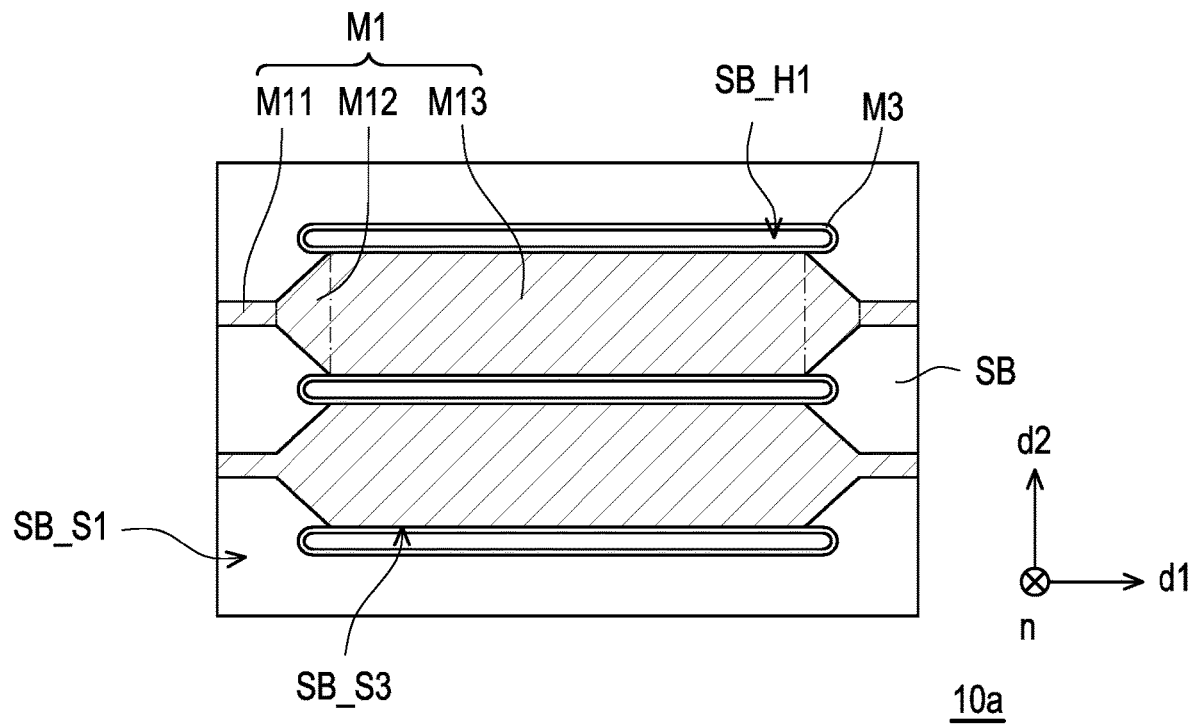
FIG. 1C is a schematic top diagram of an electronic device according to a first embodiment of the disclosure.

FIG. 1A is a flow chart of a method of manufacturing an electronic device according to an embodiment of the disclosure. FIG. 1B is a schematic exploded diagram of an electronic device according to a first embodiment of the disclosure. FIG. 1C is a schematic top diagram of an electronic device according to a first embodiment of the disclosure.

Please refer to FIG. 1A, FIG. 1B, and FIG. 1C at the same time. The method of manufacturing an electronic device 10a of the embodiment includes the following steps, for example, but the disclosure is not limited thereto.

In step S10, a glass substrate SB is provided. The glass substrate SB includes a first surface SB_S1 and a second surface SB_S2 corresponding to the first surface SB_S1.

In the embodiment, the glass substrate SB is used as the dielectric layer of the electronic device 10a, and through the regular arrangement of internal molecules and the compact structure of the glass substrate SB, dielectric loss may be reduced during signal transmission. In addition, in the embodiment, the first surface SB_S1 and the second surface SB_S2 of the electronic device 10a correspond to each other in a top view direction n of the electronic device 10a, but the disclosure is not limited thereto.

In step S20, the glass substrate SB is patterned to form at least two first through holes SB_H1. A third surface SB_S3 is formed in the glass substrate SB by the first through hole SB_H1, and the third surface SB_S3 is connected to the first surface SB_S1 and the second surface SB_S2. In some embodiments, the at least two first through holes SB_H1 may be formed by using a laser device, a CNC machine tool, or other devices suitable for a glass etching process, but the disclosure is not limited thereto. The first through hole SB_H1 may be formed, for example, on two sides of the glass substrate SB corresponding to each other so as to form a waveguide. In detail, the first through hole SB_H1 may extend, for example, in a first direction d1, and two adjacent first through holes SB_H1 in a second direction d2 may define a signal transmission area of the electronic device 10a. The first direction d1 may be perpendicular to the second direction d2, and the first direction d1 and the second direction d2 may be perpendicular to the top view direction n of the electronic device 10a, but the disclosure is not limited thereto. In the embodiment, the first through hole SB_H1 has a major axis and a minor axis. The major axis of the first through hole SB_H1 may extend in the first direction d1 (signal transmission direction), and the minor axis of the first through hole SB_H1 may extend in the second direction d2. From another point of view, the first through hole SB_H1 may have, for example, an elliptical closed shape in the top view direction n of the electronic device 10a, but the disclosure is not limited thereto. In some other embodiments, the first through hole SB_H1 may be a closed shape of a circle, a rectangle, other geometric figures, or a combination thereof in the top view direction n of the electronic device 10a.

It should be noted that although FIG. 1B and FIG. 1C show that the quantities of the first through hole SB_H1 in the first direction d1 are one, the embodiment is not limited thereto. That is, the quantities of the first through holes SB_H1 shown in FIG. 1B and FIG. 1C may be multiple in the first direction d1.

In step S30, a first conductive layer M1 is formed on the first surface SB_S1 of the glass substrate SB. The method of forming the first conductive layer M1 may be, for example, firstly forming a first conductive material layer (not shown) on the first surface SB_S1 of the glass substrate SB by an electroplating process and then performing a patterning process. The patterning process may be, for example, a microlithography method, but the disclosure is not limited thereto. In some embodiments, the material of the first conductive layer M1 may include a material with high electrical conductivity, which may include copper, silver, gold, other suitable materials, or a combination thereof. In the embodiment, the first conductive layer M1 includes a microstrip line M11, a microstrip gradient line M12, and a conductive portion M13. The opposite ends of the microstrip gradient line M12 are connected to the microstrip line M11 and the conductive portion M13 to convert the signal transmitted in the TEM mode (the components of the electric field and the magnetic field in the signal transmission direction are zero) to the signal transmitted in the TE mode (the component of the electric field in the signal transmission direction is zero). That is, the electronic device 10a is, for example, a conversion structure of a microstrip line-substrate integrated waveguide, but the disclosure is not limited thereto. In some embodiments, the first conductive layer M1 may not have the microstrip gradient line M12. In some embodiments, the first conductive layer M1 may have a signal input terminal and a signal output terminal. In detail, a signal source (not shown) may be provided on one side of the glass substrate SB. The signal source may be used to provide radio waves, microwaves, or other electromagnetic waves with different wavelength ranges. In the embodiment, the signal provided by the signal source may be transmitted from the signal input terminal to the signal output terminal along the first direction d1, but the disclosure is not limited thereto.

In step S40, a second conductive layer M2 is formed on the second surface SB_S2 of the glass substrate SB. The method of forming the second conductive layer M2 may be, for example, firstly forming a second conductive material layer (not shown) on the second surface SB_S2 of the glass substrate SB by using the electroplating process and then performing the patterning process. The patterning process may be, for example, a microlithography method, but the disclosure is not limited thereto. In some embodiments, the material of the second conductive layer M2 may be the same as or similar to the material of the first conductive layer M1, and the details are not repeated here. The second conductive layer M2 may be, for example, a ground plane. In detail, the second conductive layer M2 may be used to transmit a ground signal, but the disclosure is not limited thereto. In addition, in the embodiment, the second conductive layer M2 may have a shape corresponding to the glass substrate SB. That is, the second conductive layer M2 may also have a through hole M2_H corresponding to the first through hole SB_H1 of the glass substrate SB, but the disclosure is not limited thereto. In other embodiments, the second conductive layer M2 may have a shape corresponding to the shape of the first conductive layer M1.

In step S50, a third conductive layer M3 is formed on the third surface SB_S3 of the glass substrate SB, so that the third conductive layer M3 is electrically connected to the first conductive layer M1 and the second conductive layer M2. In detail, the third conductive layer M3 may be formed in the first through hole SB_H1 of the glass substrate SB by using a coating process, so that the first conductive layer M1 disposed on the first surface SB_S1 of the glass substrate SB and the second conductive layer M2 disposed on the second surface SB_S2 of the glass substrate SB may be electrically connected to each other, but the disclosure is not limited thereto. In some other embodiments, the third conductive layer M3 may be formed in the first through hole SB_H1 of the glass substrate SB by using the electroplating process, and the first conductive layer M1 and/or the second conductive layer M2 and the third conductive layer M3 may be optionally formed together through the electroplating process, but the disclosure is not limited thereto. In some embodiments, the material of the third conductive layer M3 may be the same as or similar to the material of the first conductive layer M1 and the second conductive layer M2. For example, the material of the third conductive layer M3 may include silver glue or copper glue. The third conductive layer M3 disposed in the first through hole SB_H1 of the glass substrate SB may, for example, serve as a barrier for signal transmission in the electronic device 10a, so that the two adjacent first through holes SB_H1 in the second direction d2 may define the signal transmission area of the electronic device 10a.

So far, the manufacturing of the electronic device 10a has been completed. However, the method of manufacturing the electronic device 10a of the disclosure is not limited thereto. For example, the first conductive layer M1, the second conductive layer M2, and the third conductive layer M3 may be formed by steps in a different sequence from the above-mentioned embodiments. In detail, in some other embodiments, step S50, step S30, and step S40 may be performed sequentially after step S20. At least two of step S50, step S30, and step S40 may be performed simultaneously. That is, the first conductive layer M1 and the third conductive layer M3 may be formed simultaneously by using the electroplating process; alternatively, the second conductive layer M2 and the third conductive layer M3 may be formed simultaneously by using the electroplating process.

Based on the above, the electronic device 10a of the embodiment uses the glass substrate SB as the dielectric layer of the conversion structure of the microstrip line-substrate integrated waveguide, which may have a relatively low cost compared with printed circuit boards or other dielectric layers. Furthermore, the glass substrate SB also has a relatively small dielectric loss coefficient, which may reduce the attenuation of the signal when the signal is transmitted in the electronic device 10a.

Figure 2:
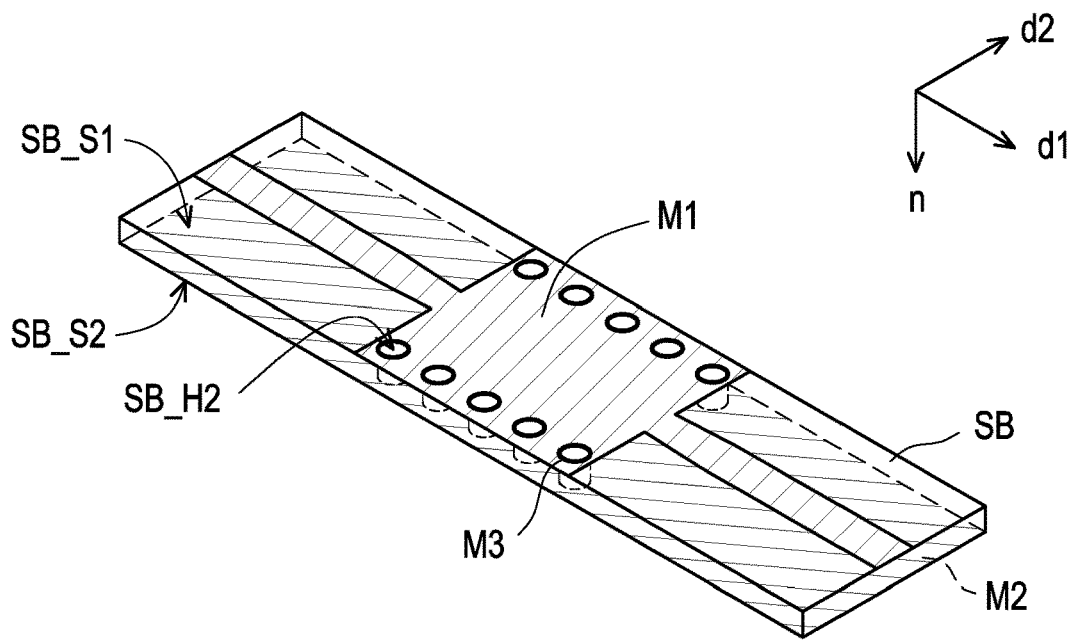
FIG. 2 is a schematic perspective diagram of an electronic device according to a second embodiment of the disclosure.

FIG. 2 is a schematic perspective diagram of an electronic device according to a second embodiment of the disclosure. It should be noted that the embodiment of FIG. 2 may continue to use the referential numbers of the components and a part of the contents of the embodiments of FIG. 1B and/or FIG. 1C, in which the same referential numbers are used to denote the same or similar components, and the description of the same technical content is omitted.

Referring to FIG. 2, the main difference between an electronic device 10b of the embodiment and the aforementioned electronic device 10a is that a quantity of a first through hole SB_H2 of the glass substrate SB is multiple in the first direction d1.

In addition, in the embodiment, the first through hole SB_H2 of the glass substrate SB may have a circular closed shape in the top view direction n of the electronic device 10b, but the disclosure is not limited thereto.

Figure 3:
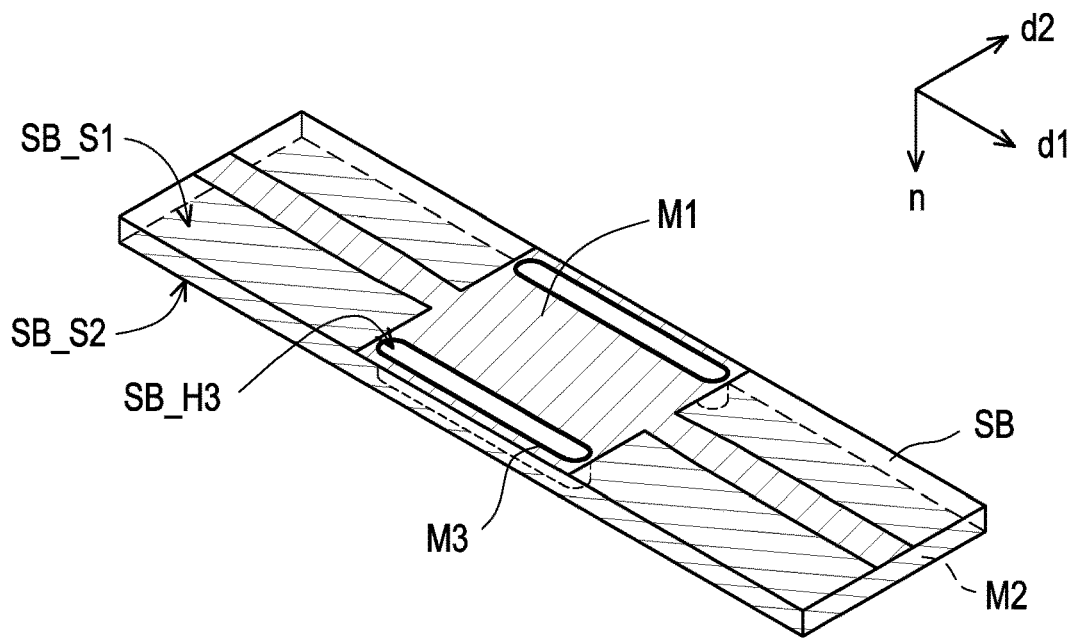
FIG. 3 is a schematic perspective diagram of an electronic device according to a third embodiment of the disclosure.

FIG. 3 is a schematic perspective diagram of an electronic device according to a third embodiment of the disclosure. It should be noted that the embodiment of FIG. 3 may continue to use the referential numbers of the components and a part of the content of the embodiment of FIG. 2, in which the same referential numbers are used to denote the same or similar components, and the description of the same technical content is omitted.

Referring to FIG. 3, the main difference between an electronic device 10c of the embodiment and the aforementioned electronic device 10b is that a quantity of a first through hole SB_H3 of the glass substrate SB is one in the first direction d1.

In addition, in the embodiment, the first through hole SB_H3 of the glass substrate SB may have an elliptical closed shape in the top view direction n of the electronic device 10c, but the disclosure is not limited thereto.

In addition, since the quantity of the first through hole SB_H3 of the electronic device 10c is one in the first direction d1, the first through hole SB_H3 may be formed by performing a relatively simple process.

Figure 4A:
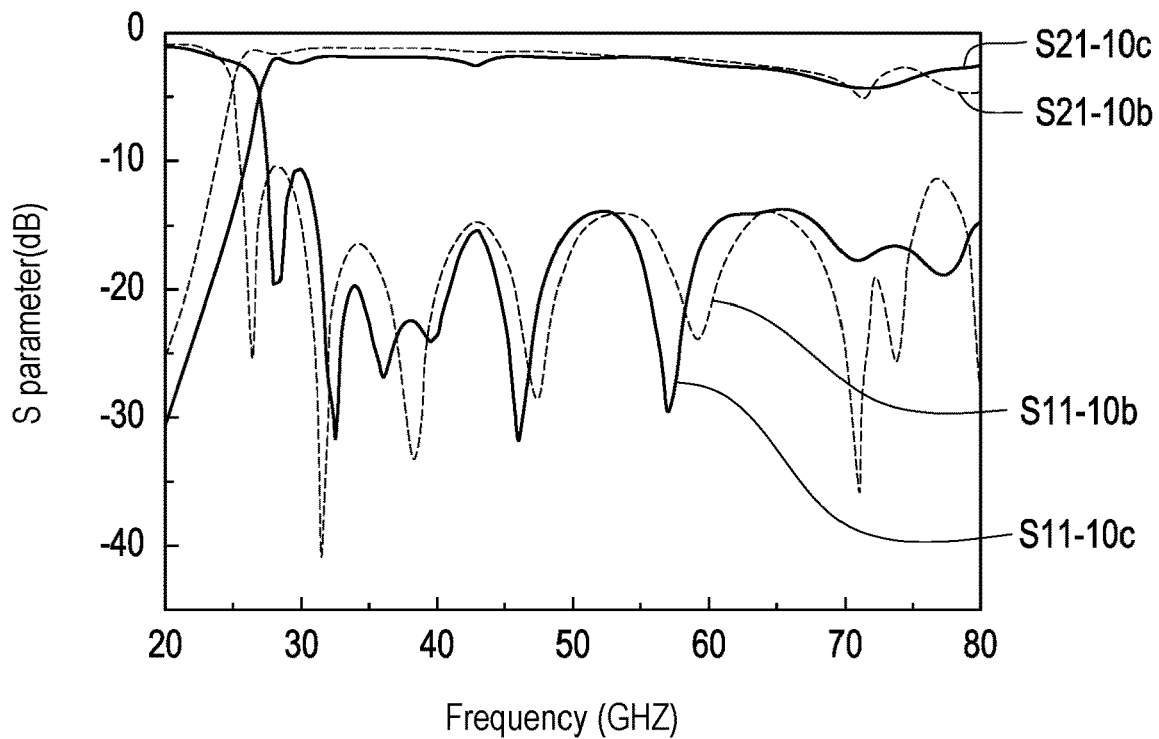
FIG. 4A is a curve diagram showing a relationship between an S parameter and a frequency of an electronic device of a second embodiment and an electronic device of a third embodiment of the disclosure.
Figure 4B:
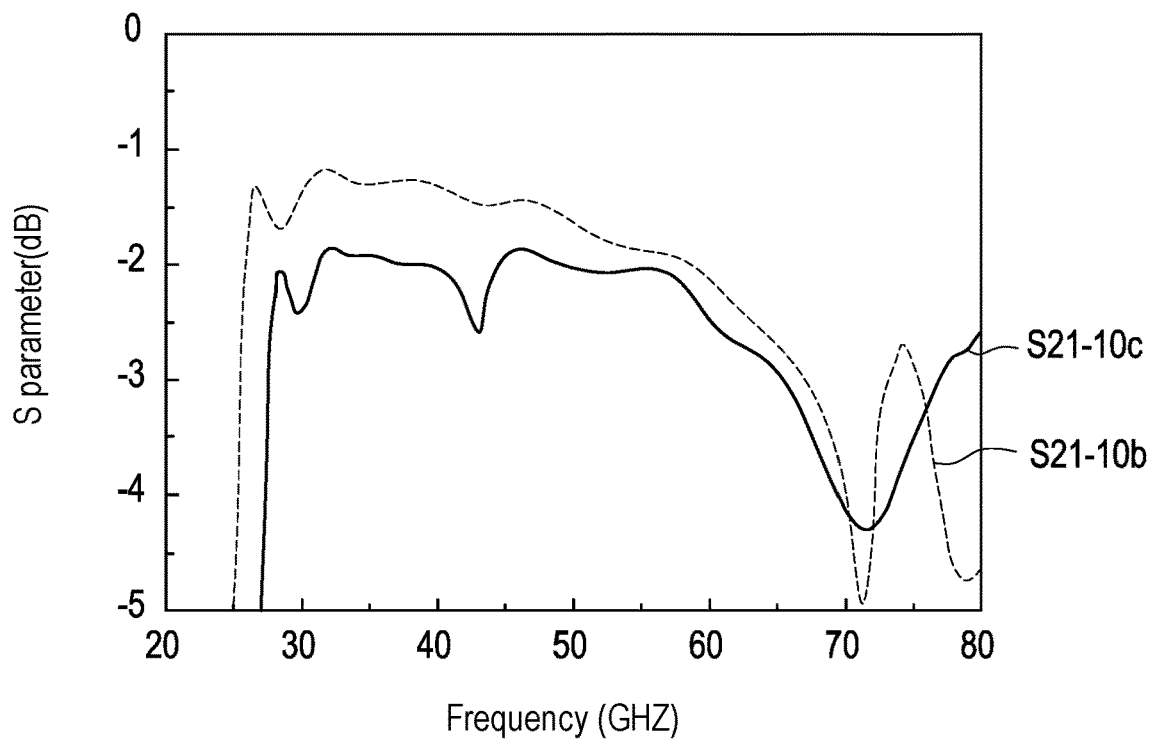
FIG. 4B is an enlarged schematic diagram of the curve S21-10b and the curve S21-10c in FIG. 4A.

FIG. 4A is a curve diagram showing a relationship between an S parameter and a frequency of an electronic device of a second embodiment and an electronic device of a third embodiment of the disclosure. FIG. 4B is an enlarged schematic diagram of the curve S11-10b and the curve S11-10c in FIG. 4A. It should be noted that, in the embodiments shown in FIG. 4A and FIG. 4B, the cutoff frequencies (fc) of the signals of the electronic device 10b and the electronic device 10c may be, for example, 20 GHz.

Please refer to FIG. 4A. A curve S11-10b is a relationship curve between an input reflection coefficient and a signal frequency measured and calculated at a signal input terminal of the electronic device 10b, and a curve S11-10c is a relationship curve between an input reflection coefficient and a signal frequency measured and calculated at a signal input terminal of the electronic device 10c. It may be seen from the curve S11-10b and the curve S11-10c that the electronic device 10b and the electronic device 10c generally have relatively low and similar input reflection coefficients (e.g., the input reflection coefficients being less than −10 dB) at high frequencies (e.g., frequencies above 20 GHz or millimeter wave frequencies), which may enable the signal to have a relatively low reflection loss.

Please refer to FIG. 4A and FIG. 4B at the same time. A curve S21-10b is a relationship curve between a forward transmission coefficient and a signal frequency measured and calculated at a signal output terminal of the electronic device 10b, and a curve S21-10c is a relationship curve between a forward transmission coefficient and a signal frequency measured and calculated at a signal output terminal of the electronic device 10c. It may be seen from the curve S21-10b and the curve S21-10c that the electronic device 10b and the electronic device 10c generally have relatively high and similar forward transmission coefficients (e.g., the forward transmission coefficients being greater than −3 dB) at high frequencies (e.g., frequencies above 20 GHz or millimeter wave frequencies), which may enable the signal to have a relatively low loss during transmission.

Figure 5A:
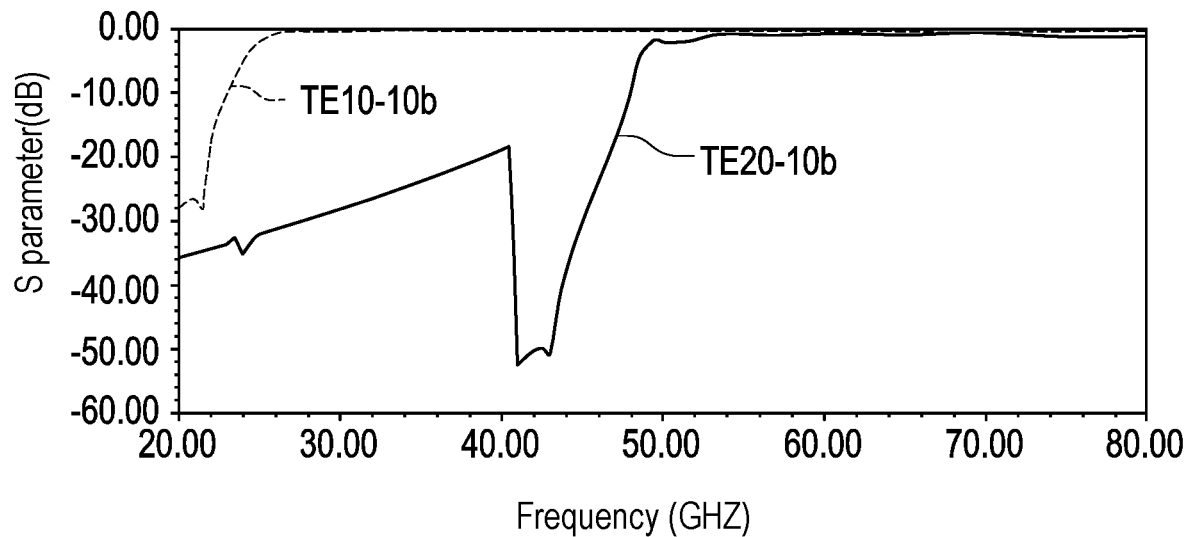
FIG. 5A is a curve diagram showing a relationship between an S parameter and a frequency of an electronic device of a second embodiment of the disclosure under a TE10 mode and a TE20 mode.
Figure 5B:
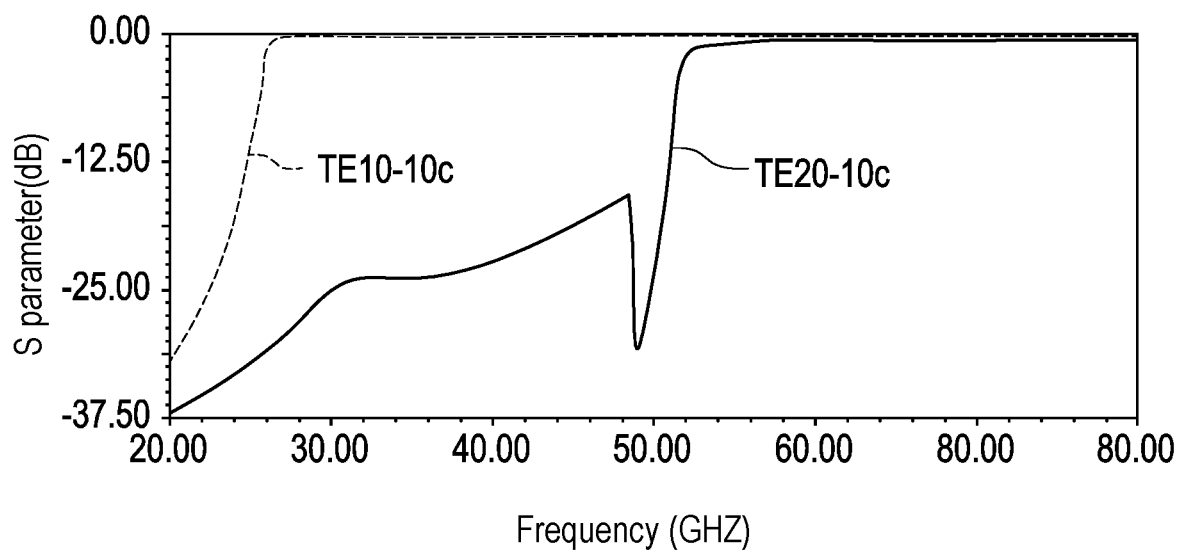
FIG. 5B is a curve diagram showing a relationship between an S-parameter and a frequency of an electronic device of a third embodiment of the disclosure under a TE10 mode and a TE20 mode.

FIG. 5A is a curve diagram showing a relationship between an S parameter and a frequency of an electronic device of a second embodiment of the disclosure under a TE10 mode and a TE20 mode. FIG. 5B is a curve diagram showing a relationship between an S-parameter and a frequency of an electronic device of a third embodiment of the disclosure under a TE10 mode and a TE20 mode. It is worth noting that the TE10 mode may be regarded as the signal wavelength performing a half-cycle change along the second direction d2, and the TE20 mode may be regarded as the signal wavelength performing the half-cycle change twice along the second direction d2. In addition, in the embodiments shown in FIG. 5A and FIG. 5B, the cutoff frequencies of the signals of the electronic device 10b and the electronic device 10c may be, for example, 20 GHz.

Please refer to FIG. 5A and FIG. 5B at the same time. A curve TE10-10b is a relationship curve between the forward transmission coefficient and the signal frequency measured and calculated at the signal output terminal of the electronic device 10b under the TE10 mode, and a curve TE10-10c is a relationship curve between the forward transmission coefficient and the signal frequency measured and calculated at the signal output terminal of the electronic device 10c under the TE10 mode; a curve TE20-10b is a relationship curve between the forward transmission coefficient and the signal frequency measured and calculated at the signal output terminal of the electronic device 10b under the TE20 mode, and a curve TE20-10c is a relationship curve between the forward transmission coefficient and the signal frequency measured and calculated at the signal output terminal of the electronic device 10c under the TE20 mode. Table 1 lists the cut-off frequencies of the electronic device 10b and the electronic device 10c under the TE10 mode and the TE20 mode, respectively.

TABLE 1

| | Cutoff frequency (fc) under TE10 mode | Cutoff frequency (fc) under TE20 mode | Bandwidth |
|---|---|---|---|
| Electronic device 10b | 24.65 GHz | 48.92 GHz | about 24 GHz |
| Electronic device 10c | 25.83 GHz | 51.79 GHz | about 26 GHz |

It may be seen from FIG. 5A, FIG. 5B, and Table 1 that the electronic device 10b including the multiple circular first through holes SB_H2 in the first direction d1 has a bandwidth of about 24 GHz, and the electronic device 10c including the elliptical first through hole SB_H3 has a bandwidth of about 26 GHz.

Figure 6:
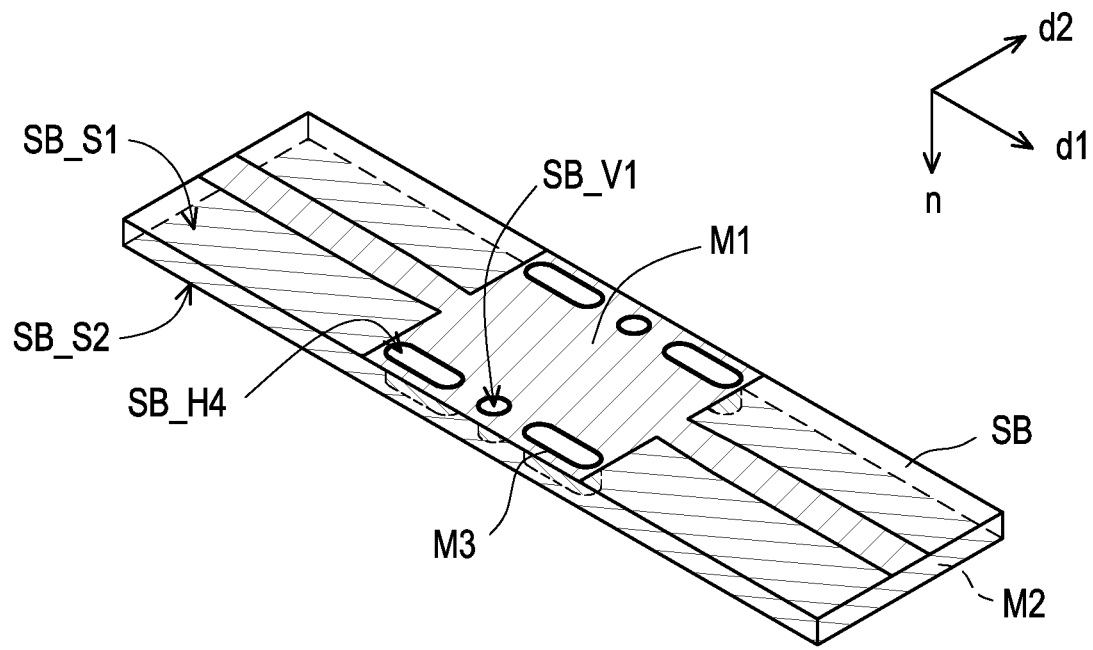
FIG. 6 is a schematic perspective diagram of an electronic device according to a fourth embodiment of the disclosure.

FIG. 6 is a schematic perspective diagram of an electronic device according to a fourth embodiment of the disclosure. It should be noted that the embodiment of FIG. 6 may continue to use the referential numbers of the components and a part of the content of the embodiment of FIG. 3, in which the same referential numbers are used to denote the same or similar components, and the description of the same technical content is omitted.

Referring to FIG. 6, the main difference between an electronic device 10d of the embodiment and the aforementioned electronic device 10c is that the glass substrate SB further includes at least one second through hole SB_V1. The second through hole SB_V1 is adjacent to a first through hole SB_H4 in the first direction d1.

In detail, compared with the aforementioned electronic device 10c, the second through hole SB_V1 of the electronic device 10d cuts off the first through hole SB_H2 originally having a long and narrow shape in the first direction d1, so that the glass substrate SB of the electronic device 10d may have two first through holes SB_H4 and one second through hole SB_V1. The second through hole SB_V1 is disposed between the two first through holes SB_H4 along the first direction d1.

In the embodiment, the second through hole SB_V1 and the first through hole SB_H4 are used to transmit different signals. For example, the second through hole SB_V1 may be used to transmit a DC signal to an electronic component (not shown) in the electronic device 10d, and enable the phase and/or amplitude of the signal to be changed by changing the voltage applied to the electronic component. Accordingly, the transmission direction of the signal may be controlled and/or the directivity of the electronic component may be improved, but the disclosure is not limited thereto.

In addition, in the embodiment, the second through hole SB_V1 of the glass substrate SB may have a circular closed shape in the top view direction n of the electronic device 10d, but the disclosure is not limited thereto.

Figure 7A:
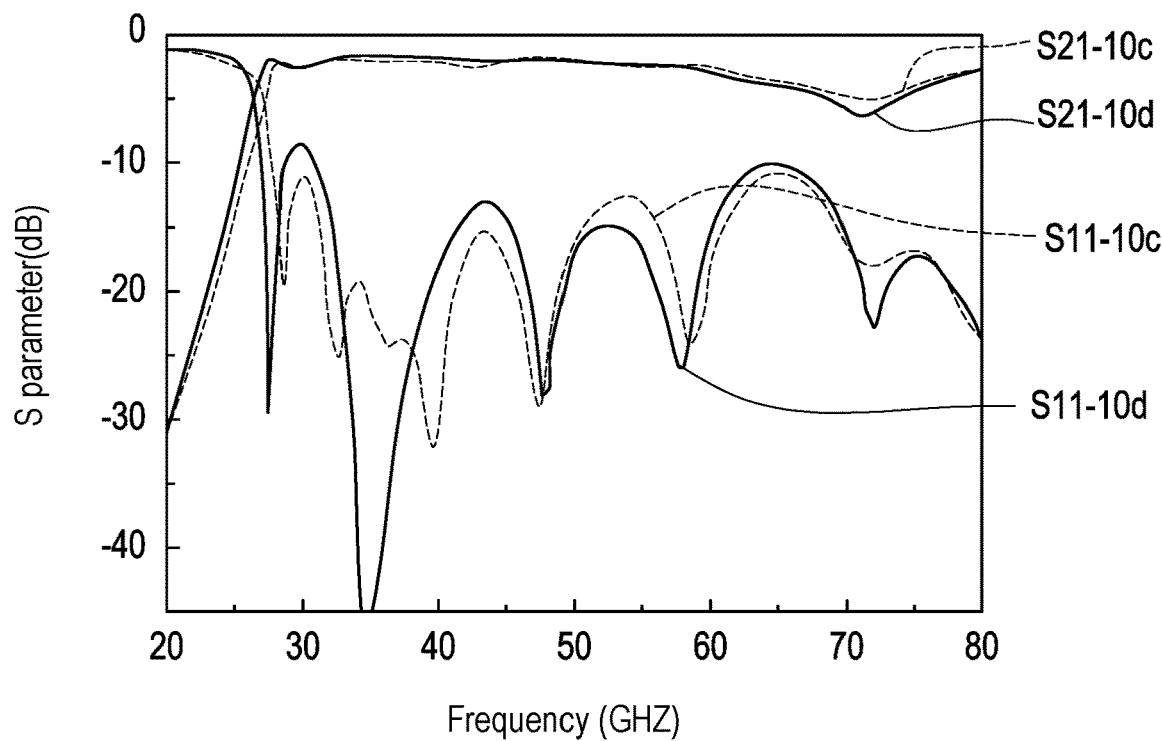
FIG. 7A is a curve diagram showing a relationship between an S parameter and a frequency of an electronic device of a third embodiment and an electronic device of a fourth embodiment of the disclosure.
Figure 7B:
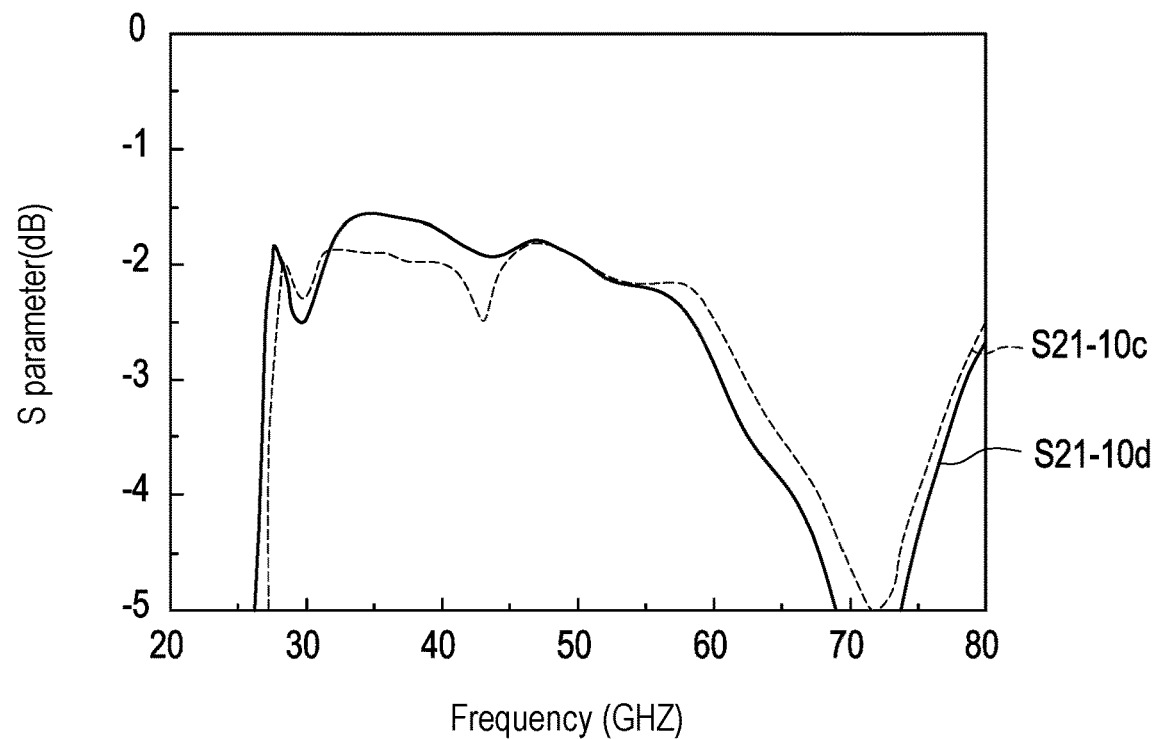
FIG. 7B is an enlarged schematic diagram of the curve S21-10c and the curve S21-10d in FIG. 7A.

FIG. 7A is a curve diagram showing a relationship between an S parameter and a frequency of an electronic device of a third embodiment and an electronic device of a fourth embodiment of the disclosure. FIG. 7B is an enlarged schematic diagram of the curve S21-10c and the curve S21-10d in FIG. 7A. It is worth noting that, in the embodiments shown in FIGS. 7A and FIG. 7B, the cutoff frequencies of the signals of the electronic device 10c and the electronic device 10d may be, for example, 20 GHz.

Please refer to FIG. 7A. The curve S11-10c is the relationship curve between the input reflection coefficient and the signal frequency measured and calculated at the signal input terminal of the electronic device 10c, and a curve S11-10d is a relationship curve between an input reflection coefficient and a signal frequency measured and calculated at a signal input terminal of the electronic device 10d. From the curve S11-10c and the curve S11-10d, it may be seen that the electronic device 10c and the electronic device 10d generally have relatively low and similar input reflection coefficients (e.g., the input reflection coefficients being less than −10 dB) at high frequencies (e.g., frequencies above 20 GHz or millimeter wave frequencies), which may enable the signal to have a relatively low reflection loss.

Please refer to FIG. 7A and FIG. 7B at the same time. The curve S21-10c is the relationship curve between the forward transmission coefficient and the signal frequency measured and calculated at the signal output terminal of the electronic device 10c, and a curve S21-10d is a relationship curve between a forward transmission coefficient and a signal frequency measured and calculated at a signal output terminal of the electronic device 10d. It may be seen from the curve S21-10c and the curve S21-10d that the electronic device 10c and the electronic device 10d generally have relatively high and similar forward transmission coefficients (e.g., the forward transmission coefficients being greater than −3 dB) at high frequencies (e.g., frequencies above 20 GHz or millimeter wave frequencies), which may enable the signal to have a relatively low loss during transmission.

Based on the above, through the disposition of the second through hole SB_V1, the transmission direction of the signal may be controlled and/or the directivity of the electronic component may be improved without substantially affecting the frequency response of the electronic device 10d.

Figure 8A:
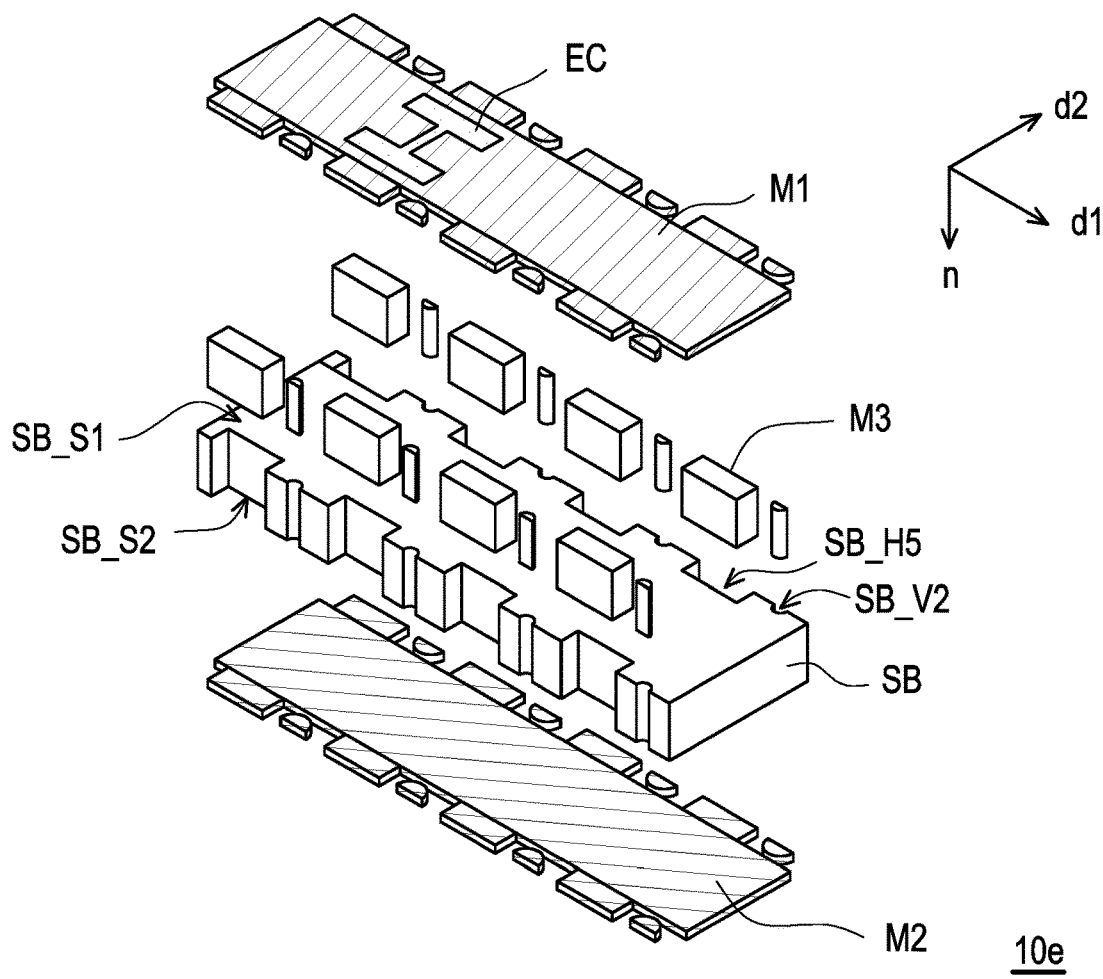
FIG. 8A is a schematic exploded diagram of an electronic device according to a fifth embodiment of the disclosure.
Figure 8B:
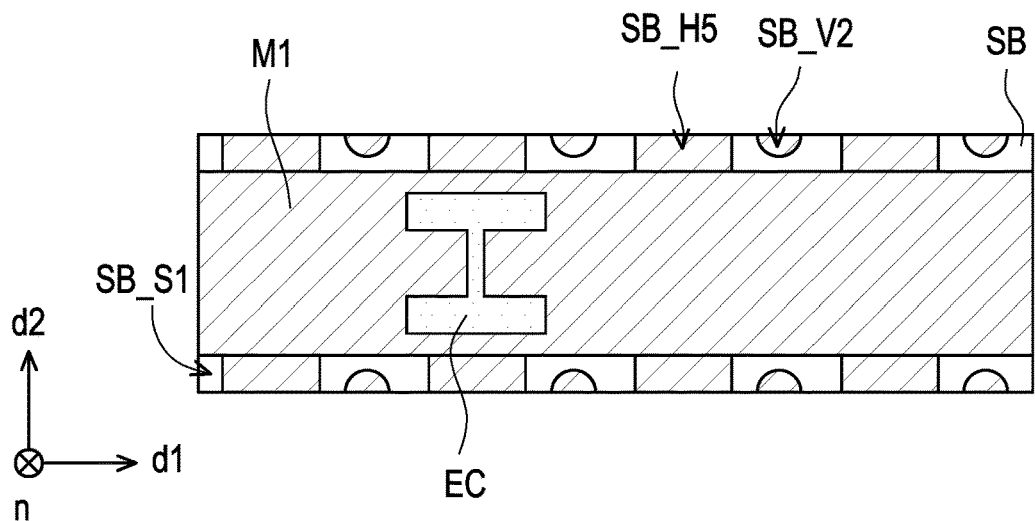
FIG. 8B is a schematic top view diagram of an electronic device according to a fifth embodiment of the disclosure.

FIG. 8A is a schematic exploded diagram of an electronic device according to a fifth embodiment of the disclosure. FIG. 8B is a schematic top view diagram of an electronic device according to a fifth embodiment of the disclosure.

Referring to FIG. 8A and FIG. 8B at the same time, the main differences between an electronic device 10e of the embodiment and the aforementioned electronic device 10d are that: (1) a first through hole SB_H5 and a second through hole SB_V2 of the glass substrate SB are disposed on an edge of the first surface SB_S1 and an edge of the second surface SB_S2 of the glass substrate SB; and (2) an electronic component EC is further included.

In detail, the first through hole SB_H5 and the second through hole SB_V2 may be formed, for example, by removing a side surface of the original glass substrate SB, and may also be formed by using a laser device, a CNC machine tool, or other devices suitable for a glass etching process, but this disclosure is not limited thereto. In the embodiment, the first through hole SB_H5 of the glass substrate SB may have a rectangular shape in the top view direction n of the electronic device 10e, and the second through hole SB_V2 of the glass substrate SB may have a semicircular shape in the top view direction n of the electronic device 10e, but the disclosure is not limited thereto. In some embodiments, the shapes of the first through hole SB_H5 and the second through hole SB_V2 may also be the same. In addition, the second through hole SB_V2 and the first through hole SB_H5 may also be used to transmit different signals, for example, and the details are not repeated here.

In the embodiment, the electronic component EC is disposed on the first surface SB_S1 of the glass substrate SB and is electrically connected to the first conductive layer M1. The electronic component EC receives the DC signal through the second through hole SB_V2 and receives the ground signal through the first through hole SB_H5. In some embodiments, the electronic component EC includes a radio frequency component. That is, the electronic component EC may be, for example, an electronic component suitable for the communication field, the radar/lidar field, the reconfigurable intelligent surface (rIS) technology, or other suitable fields/technologies, but the disclosure is not limited thereto. In some embodiments, the electronic component EC may include a variable capacitor, a variable resistor, a varactor diode, a phase shifter, an amplifier, an antennas, a biometric sensor, a graphene sensor, other suitable electronic components, or a combination thereof. In addition, the electronic component EC may control the transmission direction of the signal and/or improve the directivity of the above-mentioned electronic component, for example, by receiving the DC signal from the second through hole SB_V2, but the disclosure is not limited thereto.

Figure 9:
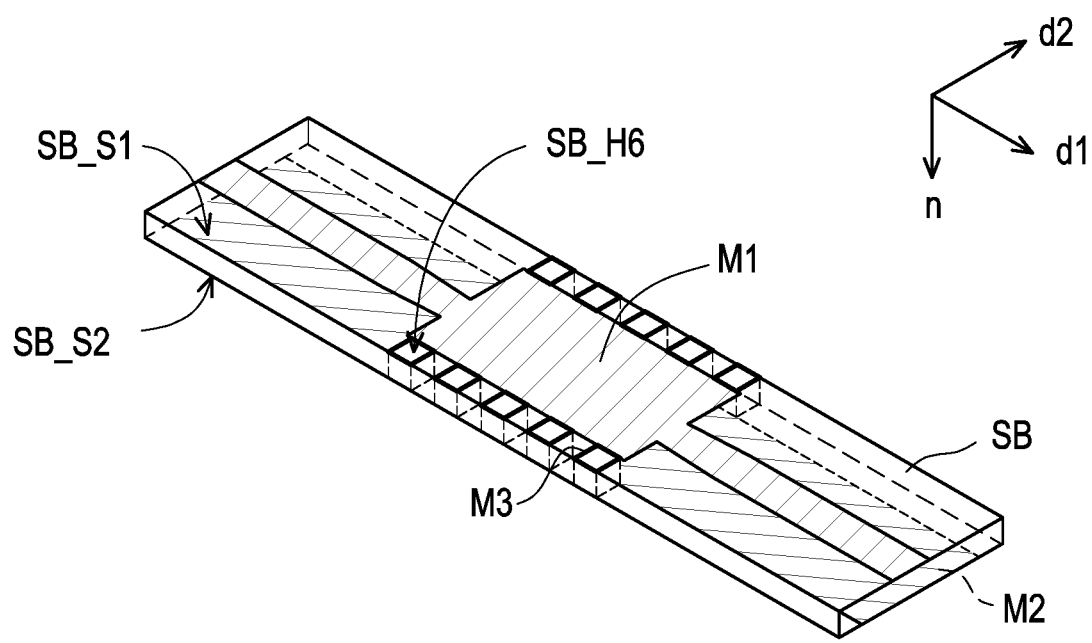
FIG. 9 is a schematic perspective diagram of an electronic device according to a sixth embodiment of the disclosure.

FIG. 9 is a schematic perspective diagram of an electronic device according to a sixth embodiment of the disclosure. It should be noted that the embodiment of FIG. 9 may continue to use the referential numbers of the components and a part of the content of the embodiment of FIG. 2, in which the same referential numbers are used to denote the same or similar components, and the description of the same technical content is omitted.

Referring to FIG. 9, the main difference between an electronic device 10f of the embodiment and the aforementioned electronic device 10b is that a first through hole SB_H6 of the glass substrate SB is disposed on the edge of the first surface SB_S1 and the edge of the second surface SB_S2 of the glass substrate SB and has a rectangular shape in the top view direction n of the electronic device 10f.

It is worth noting that although the embodiment shows that the first through hole SB_H6 of the glass substrate SB is disposed on the edge of the first surface SB_S1 and the edge of the second surface SB_S2 of the glass substrate SB to have an unclosed shape, the disclosure is not limited thereto. In other embodiments, the first through hole SB_H6 of the glass substrate SB may have a rectangular closed shape in the top view direction n of the electronic device 10f.

Figure 10A:
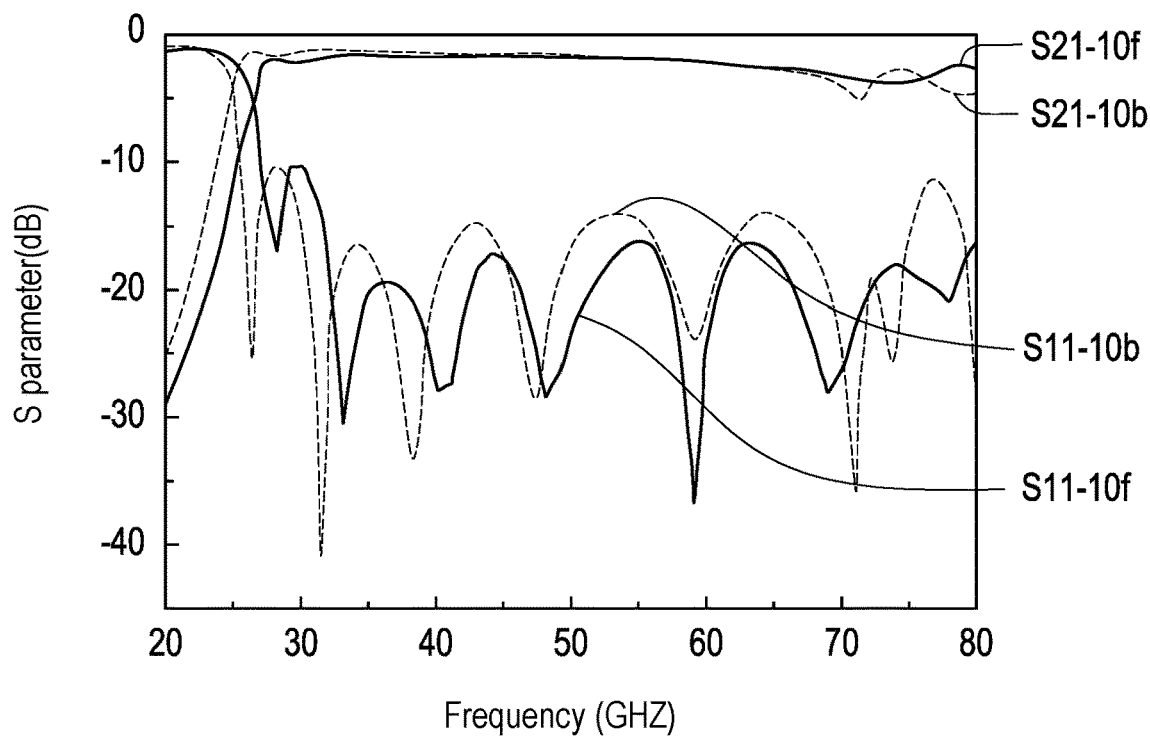
FIG. 10A is a curve diagram showing a relationship between an S parameter and a frequency of an electronic device of a second embodiment and an electronic device of a sixth embodiment of the disclosure.
Figure 10B:
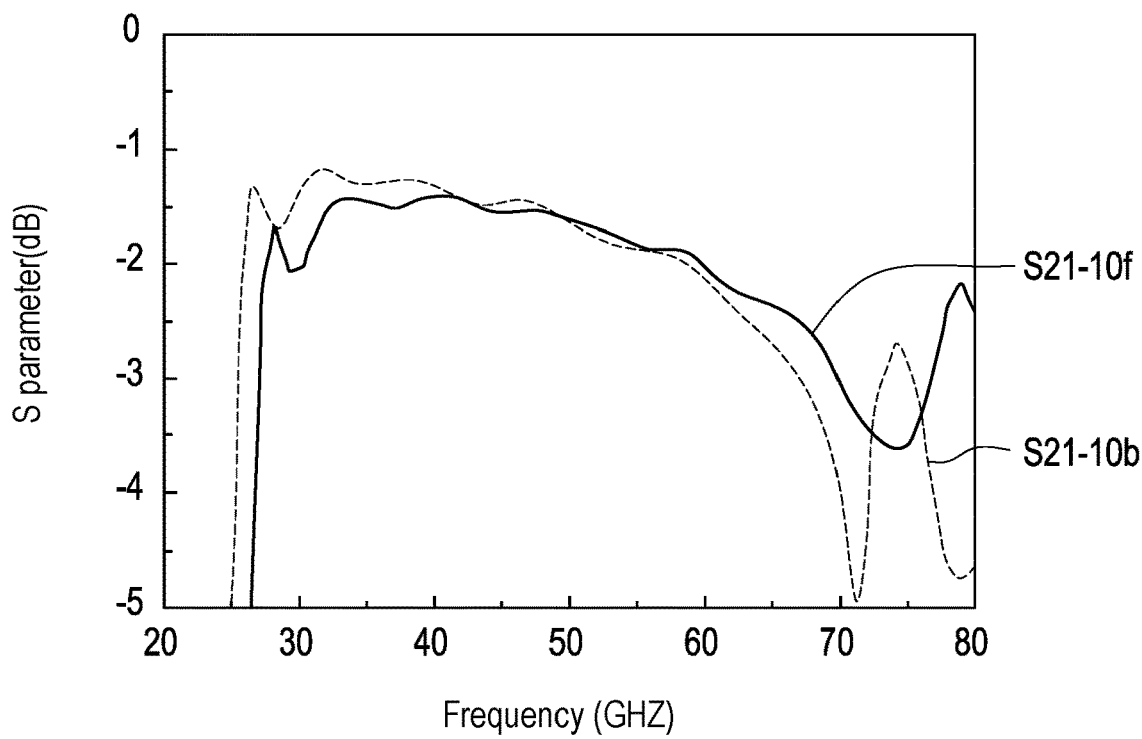
FIG. 10B is an enlarged schematic diagram of the curve S21-10b and the curve S21-10f in FIG. 10A.

FIG. 10A is a curve diagram showing a relationship between an S parameter and a frequency of an electronic device of a second embodiment and an electronic device of a sixth embodiment of the disclosure. FIG. 10B is an enlarged schematic diagram of the curve S21-10b and the curve S21-10f in FIG. 10A. It is worth noting that, in the embodiments shown in FIG. 10A and FIG. 10B, the cutoff frequencies of the signals of the electronic device 10b and the electronic device 10f may be, for example, 20 GHz.

Please refer to FIG. 10A. The curve S11-10b is the relationship curve between the input reflection coefficient and the signal frequency measured and calculated at the signal input terminal of the electronic device 10b, and a curve S11-10f is a relationship curve between an input reflection coefficient and a signal frequency measured and calculated at a signal input terminal of the electronic device 10f. From the curve S11-10b and the curve S11-10f, it may be seen that the electronic device 10b and the electronic device 10f generally have relatively low and similar input reflection coefficients (e.g., the input reflection coefficients being less than −10 dB) at high frequencies (e.g., frequencies above 20 GHz or millimeter wave frequencies), which may enable the signal to have a relatively low reflection loss.

Please refer to FIG. 10A and FIG. 10B at the same time. The curve S21-10b is the relationship curve between the forward transmission coefficient and the signal frequency measured and calculated at the signal output terminal of the electronic device 10b, and the curve S21-10f is a relationship curve between a forward transmission coefficient and a signal frequency measured and calculated at a signal output terminal of the electronic device 10f. From the curve S21-10b and the curve S21-10f, it may be seen that the electronic device 10b and the electronic device 10f generally have relatively high and similar forward transmission coefficients (e.g., the forward transmission coefficients being greater than −3 dB) at high frequencies (e.g., frequencies above 20 GHz or millimeter wave frequencies), which may enable the signal to have a relatively low loss during transmission.

Based on the above, compared with the electronic device 10b, the first through hole SB_H6 of the glass substrate SB is disposed on the edge of the first surface SB_S1 and the edge of the second surface SB_S2 of the glass substrate SB, and a rectangular shape disposed in the top view direction n of the electronic device 10f does not substantially affect the frequency response of the electronic device 10f.

Figure 11:
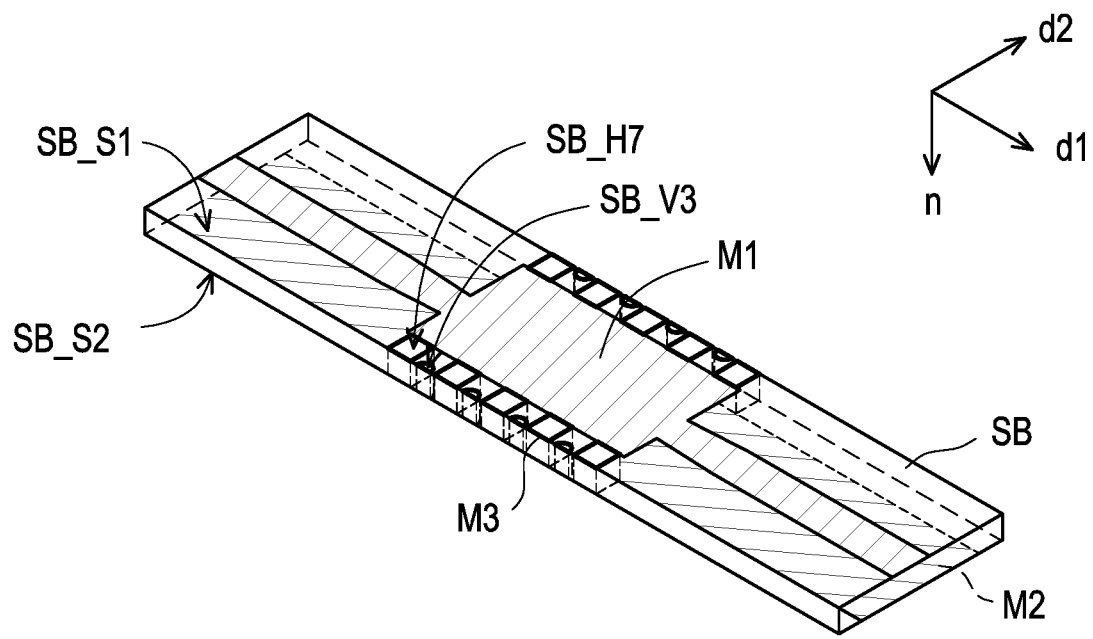
FIG. 11 is a schematic perspective diagram of an electronic device according to a seventh embodiment of the disclosure.

FIG. 11 is a schematic perspective diagram of an electronic device according to a seventh embodiment of the disclosure. It should be noted that the embodiment of FIG. 11 may continue to use the referential numbers of the components and a part of the content of the embodiment of FIG. 9, in which the same referential numbers are used to denote the same or similar components, and the description of the same technical content is omitted.

Referring to FIG. 11, the main difference between an electronic device 10g of the embodiment and the aforementioned electronic device 10f is that the glass substrate SB further includes at least one second through hole SB_V3. The second through hole SB_V3 is adjacent to a first through hole SB_H7 in the first direction d1.

In detail, compared with the aforementioned electronic device 10f, the electronic device 10g further includes the at least one second through hole SB_V3 arranged in the first direction d1. The at least one second through hole SB_V3 of the electronic device 10g is disposed between two adjacent first through holes SB_H7.

In the embodiment, the second through hole SB_V3 and the first through hole SB_H7 are used to transmit different signals. For example, the second through hole SB_V3 may be used to transmit a DC signal to the electronic component (not shown) in the electronic device 10g, and enable the phase and amplitude of the signal to be changed by changing the voltage applied to the electronic component. Accordingly, the transmission direction of the signal may be controlled and/or the directivity of the electronic component may be improved, but the disclosure is not limited thereto.

In addition, in the embodiment, the second through hole SB_V3 of the glass substrate SB may have a semicircular closed shape in the top view direction n of the electronic device 10g, or may be disposed on the edge of the first surface SB_S1 and the edge of the second surface SB_S2 of the glass substrate SB, but the disclosure is not limited thereto.

Figure 12:
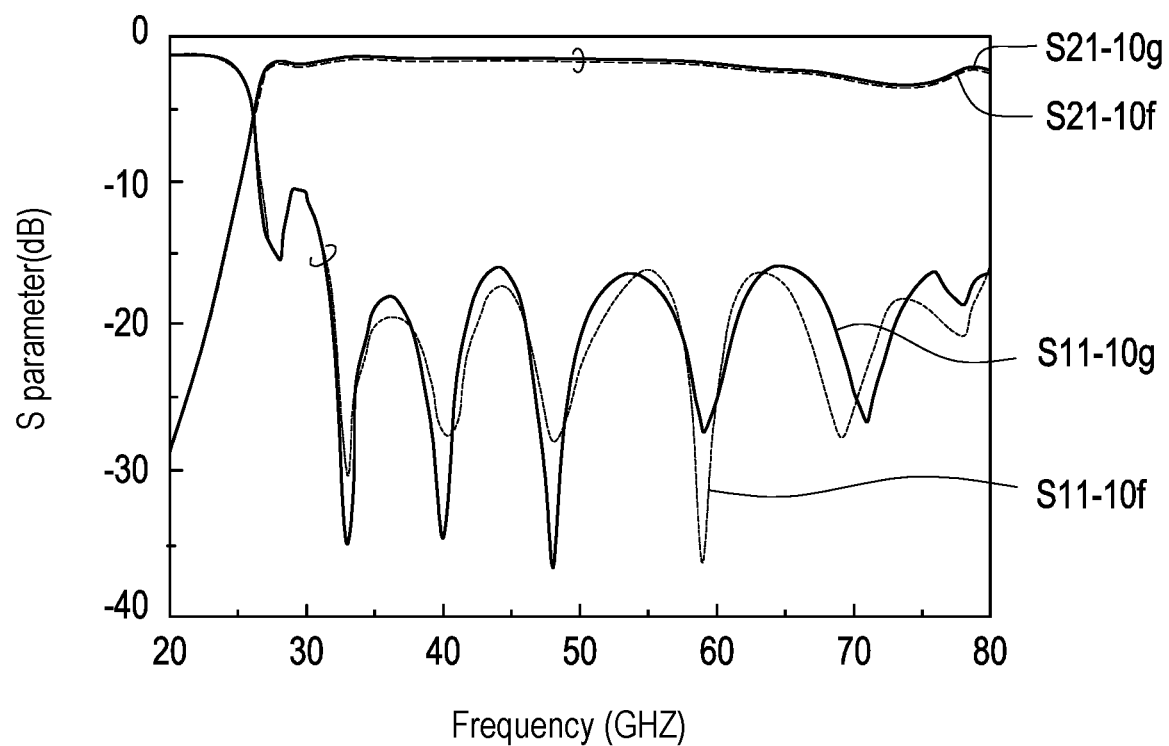
FIG. 12 is a curve diagram showing a relationship between an S parameter and a frequency of an electronic device of a sixth embodiment and an electronic device of a seventh embodiment of the disclosure.

FIG. 12 is a curve diagram showing a relationship between an S parameter and a frequency of an electronic device of a sixth embodiment and an electronic device of a seventh embodiment of the disclosure.

Please refer to FIG. 12. The curve S11-10f is the relationship curve between the input reflection coefficient and the signal frequency measured and calculated at the signal input terminal of the electronic device 10f, and a curve S11-10g is a relationship curve between an input reflection coefficient and a signal frequency measured and calculated at a signal input terminal of the electronic device 10g. From the curve S11-10f and the curve S11-10g, it may be seen that the electronic device 10f and the electronic device 10g generally have relatively low and similar input reflection coefficients (e.g., the input reflection coefficient being less than −10 dB) at high frequencies (e.g., frequencies above 20 GHz or millimeter wave frequencies), which may enable the signal to have a relatively low reflection loss.

Please continue to refer to FIG. 12. The curve S21-10f is the relationship curve between the forward transmission coefficient and the signal frequency measured and calculated at the signal output terminal of the electronic device 10f, and a curve S21-10g is a relationship curve between a forward transmission coefficient and a signal frequency measured and calculated at the signal output terminal of the electronic device 10g. From the curve S21-10f and the curve S21-10g, it may be seen that the electronic device 10f and the electronic device 10g generally have relatively high and similar forward transmission coefficients (e.g., the forward transmission coefficients being greater than −3 dB) at high frequencies (e.g., frequencies above 20 GHz or millimeter wave frequencies), which may enable the signal to have a relatively low loss during transmission.

Based on the above, through the disposition of the second through hole SB_V3, the transmission direction of the signal may be controlled and/or the directivity of the electronic component may be improved without substantially affecting the frequency response of the electronic device 10g.

Figure 13A:
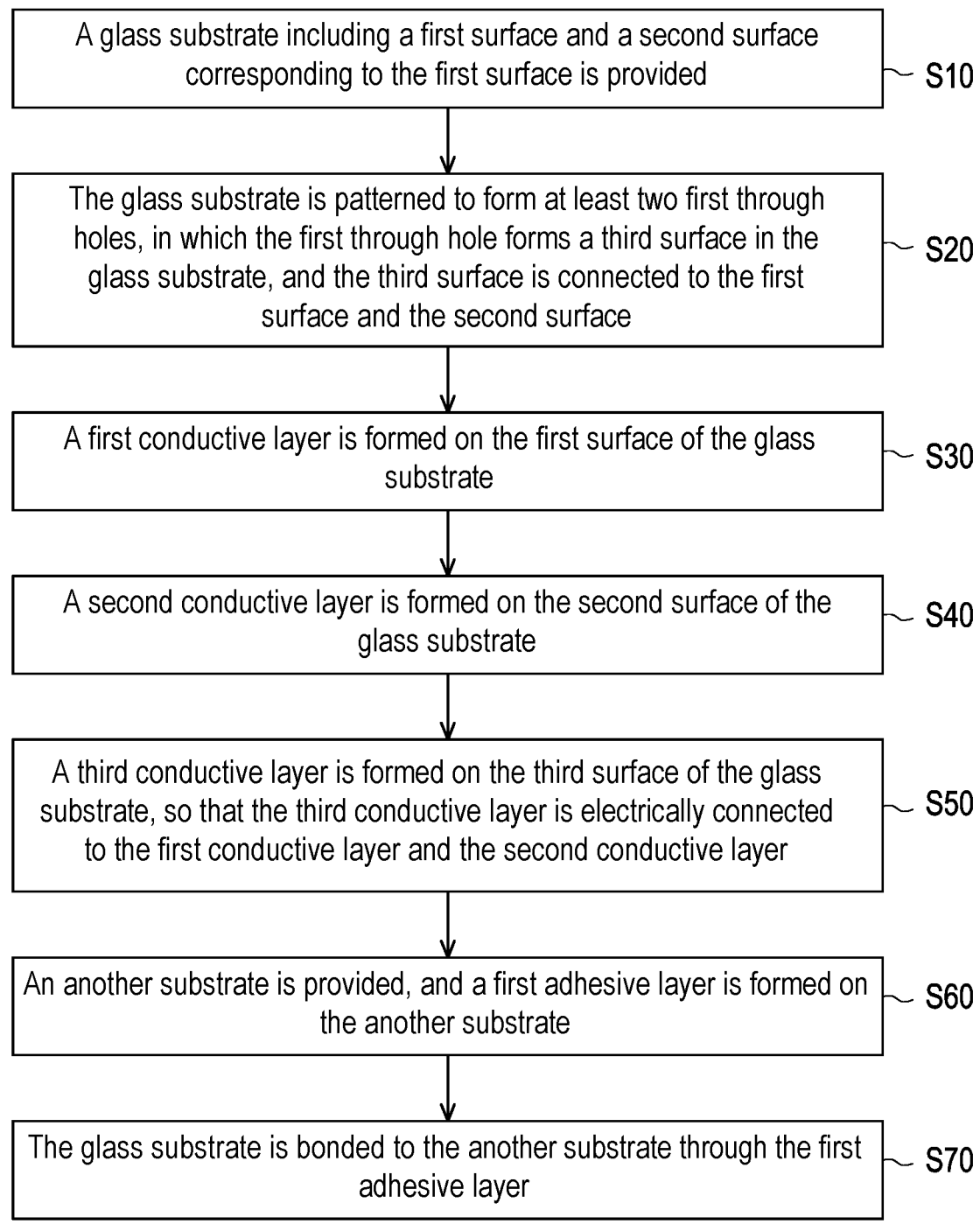
FIG. 13A is a flow chart of a method of manufacturing an electronic device according to another embodiment of the disclosure.
Figure 13B:
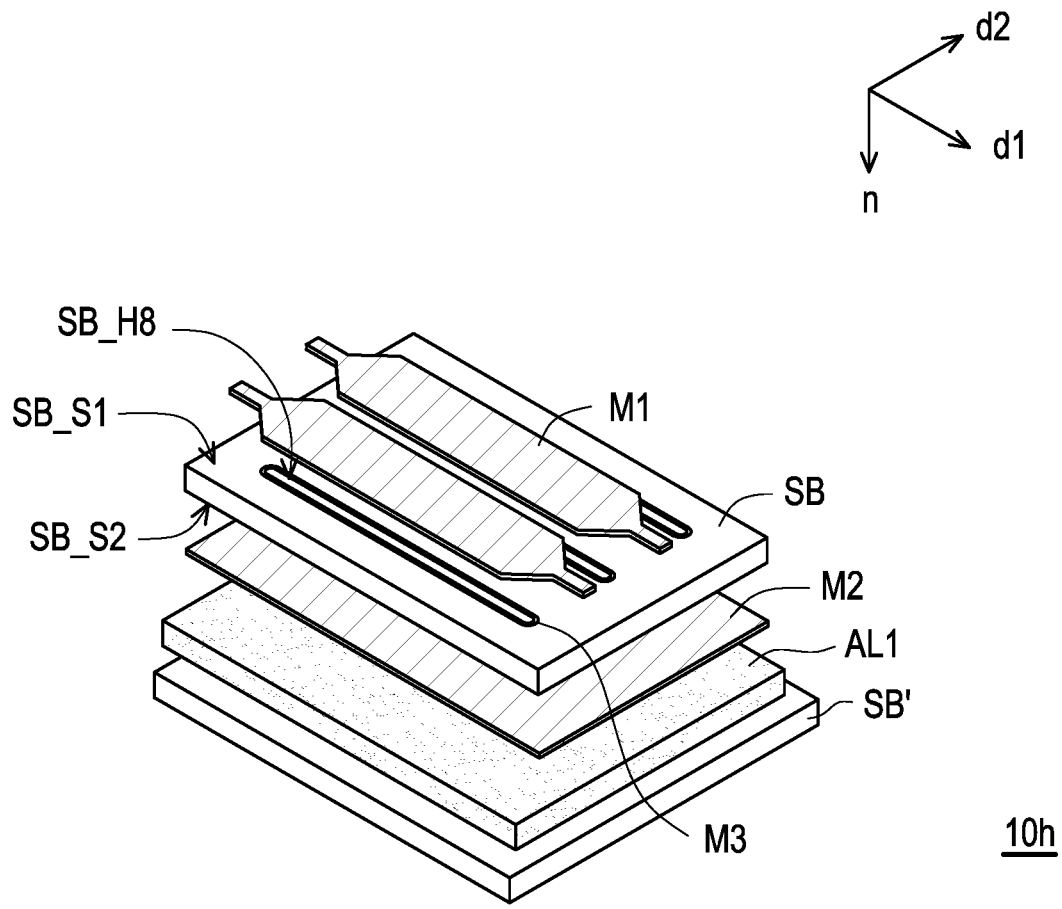
FIG. 13B is a schematic perspective diagram of an electronic device according to an eighth embodiment of the disclosure.

FIG. 13A is a flow chart of a method of manufacturing an electronic device according to another embodiment of the disclosure, and FIG. 13B is a schematic perspective diagram of an electronic device according to an eighth embodiment of the disclosure. It should be noted that, the embodiment of FIG. 13A and FIG. 13B may continue to use the referential numbers of the components and a part of the contents of the embodiments of FIG. 1A to FIG. 1C, in which the same referential numbers are used to denote the same or similar components, and the description of the same technical content is omitted.

Please refer to FIG. 13A and FIG. 13B at the same time. The method of manufacturing an electronic device 10h of the embodiment includes, for example, the following steps. For the detailed processes from step S10 to step S50, reference may be made to the foregoing embodiments, and the details are not repeated here. It is worth noting that there are at least two first through holes SB_H8 in the substrate SB on corresponding two sides of each first metal layer M1, and although the first through hole SB_H8 is shown to have a closed shape of an ellipse in the top view direction n of the electronic device 10h, the disclosure is not limited thereto. For other aspects of the first through hole SB_H8, reference may be made to the foregoing embodiments, and the details are not repeated here.

After performing step S50, in step S60, a substrate SB' is provided, and a first adhesive layer AL1 is formed on the substrate SB'. In the embodiment, the substrate SB' may be a rigid substrate, a bendable substrate, or a flexible substrate. For example, the substrate SB' may include a printed circuit board, a glass substrate, a ceramic substrate, or a combination thereof, and the disclosure is not limited thereto. In some embodiments, the substrate SB' may be used to carry suitable electronic components, but the disclosure is not limited thereto.

The first adhesive layer AL1 may, for example, include a suitable adhesive material, and the disclosure is not limited thereto.

Next, in step S70, the glass substrate SB is bonded to the substrate SB' through the first adhesive layer AL1. In detail, the second surface SB_S2 provided with a second metal layer M2 on the glass substrate SB may face the surface provided with the first adhesive layer AL1 on the substrate SB', and the glass substrate SB may be bonded to the substrate SB' through the first adhesive layer AL1.

So far, the manufacturing of the electronic device 10h has been completed. However, the method of manufacturing the electronic device 10h of the disclosure is not limited thereto.

Figure 14A:
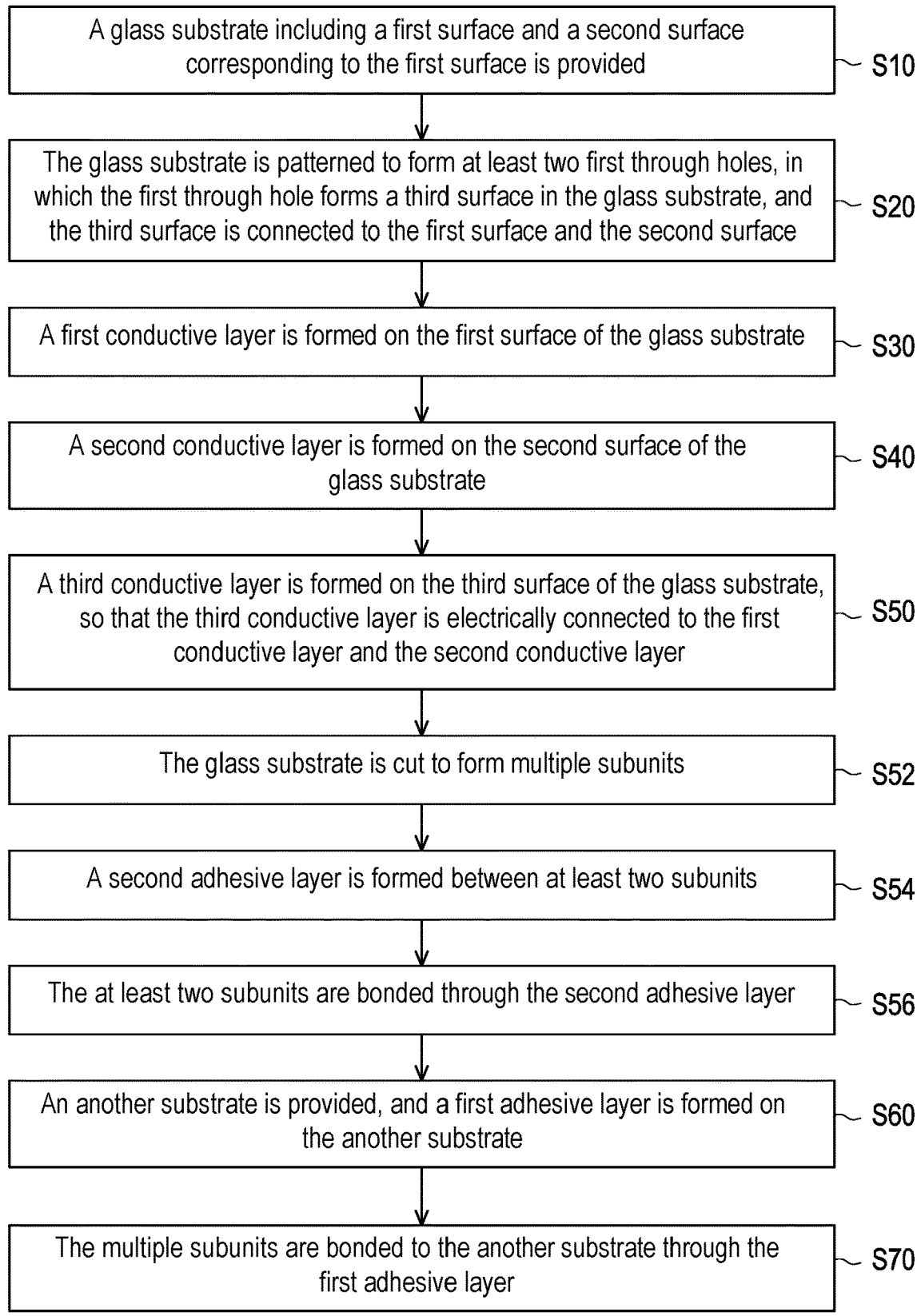
FIG. 14A is a flow chart of a method of manufacturing an electronic device according to still another embodiment of the disclosure.
Figure 14B:
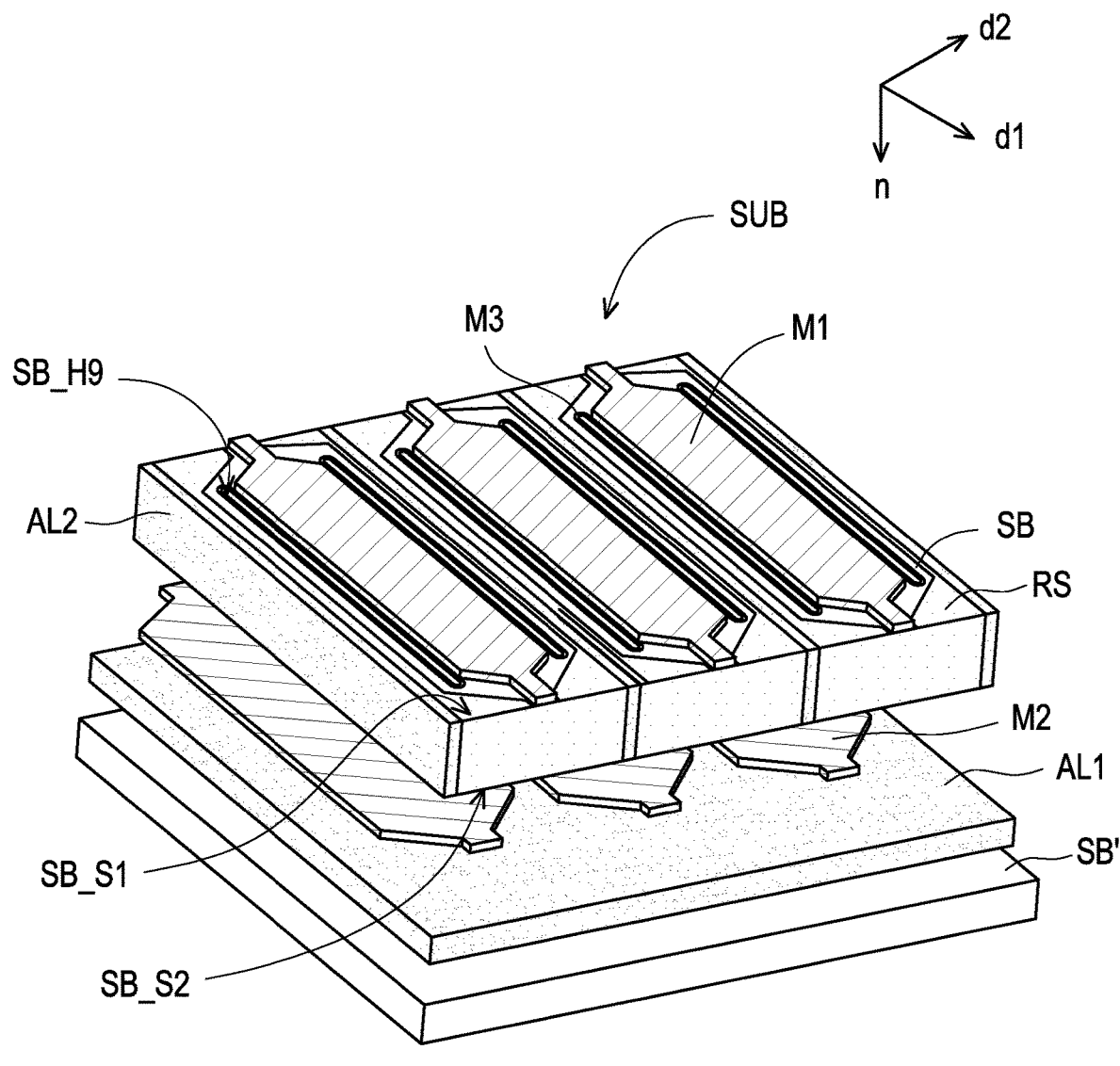
FIG. 14B is a schematic perspective diagram of an electronic device according to a ninth embodiment of the disclosure.

FIG. 14A is a flow chart of a method of manufacturing an electronic device according to still another embodiment of the disclosure. FIG. 14B is a schematic perspective diagram of an electronic device according to a ninth embodiment of the disclosure. It should be noted that, the embodiment of FIG. 14A and FIG. 14B may continue to use the referential numbers of the components and a part of the contents of the embodiments of FIG. 13A and FIG. 13B, in which the same referential numbers are used to denote the same or similar components, and the description of the same technical content is omitted.

Please refer to FIG. 14A and FIG. 14B at the same time. The method of manufacturing an electronic device 10i of the embodiment includes, for example, the following steps. For the detailed processes from step S10 to step S50, reference may be made to the foregoing embodiments, and the details are not repeated here.

After performing step S50, in step S52, the glass substrate SB is cut to form multiple subunits SUB. In some embodiments, the glass substrate SB may be cut by using a laser cutting process or a knife wheel cutting process, but the disclosure is not limited thereto. In addition, in some embodiments, the second metal layer M2 may also be cut by using a laser cutting process or a knife wheel cutting process. The cut second metal layer M2 and the cut glass substrate SB may have the same or similar shapes, but the disclosure is not limited thereto. Based on the above, the sub-unit SUB may include, for example, the first metal layer M1, the cut second metal layer M2, a third metal layer M3, and the cut glass substrate SB. In addition, each subunit SUB may have at least two first through holes SB_H9 formed on two sides of the glass substrate SB corresponding each other so as to form a waveguide, and although the first through hole SB_H9 is shown to have a closed shape of an ellipse in the top view direction n of the electronic device 10i, the disclosure is not limited thereto. For other aspects of the first through hole SB_H9, reference may be made to the foregoing embodiments, and the details are not repeated here.

In step S70, the multiple subunits SUB are bonded to the substrate SB' through the first adhesive layer AL1. In detail, for example, the first adhesive layer AL1 may be firstly formed on the substrate SB'. The first adhesive layer AL1 may include a suitable adhesive material, and the disclosure is not limited thereto. Afterwards, the second surface SB_S2 provided with the second metal layer M2 on the multiple subunits SUB may face the surface provided with the first adhesive layer AL1 on the substrate SB', and the multiple subunits SUB are bonded to the substrate SB' through the first adhesive layer AL1.

In some embodiments, before performing step S70, it may further include performing the following step S54, step S56, and step S60.

First, in step S24, a second adhesive layer AL2 is formed between at least two subunits SUB. The second adhesive layer AL2 may be disposed between adjacent subunits SUB in the second direction d2, and the second adhesive layer AL2 may, for example, include a suitable adhesive material, and the disclosure is not limited thereto. In the embodiment shown in FIG. 14B, before forming the second adhesive layer AL2, it may include forming a protective layer RS between the at least two subunits SUB. The protective layer RS may be used, for example, to further fix the shape of the subunit SUB, and may be used, for example, to protect the first metal layer M1, the second metal layer M2, the third metal layer M3, and the glass substrate SB in the subunit SUB, but the disclosure is not limited thereto.

Afterwards, in step S56, the at least two subunits SUB are bonded through the second adhesive layer AL2. That is, the adjacent subunits SUB in the second direction d2 may be bonded to each other through the second adhesive layer AL2. Next, step S60 is performed. For the detailed process of step S60, reference may be made to the foregoing embodiments, and the details are not repeated here.

In summary, some embodiments of the disclosure use the glass substrate as the dielectric layer of the electronic device, which may have a relatively low cost compared with printed circuit boards or other dielectric layers and may reduce the attenuation of the signal when the signal is transmitted in the electronic device.

Other embodiments of the disclosure provide the various structures for forming the first through hole defining the signal transmission area of the electronic device, which may be formed by performing a relatively simple process compared with the prior art and may also enable the signal to have a relatively low loss during transmission.

In still some other embodiments of the disclosure, a second through hole is disposed on the glass substrate, which is adjacent to the first through hole and transmits a signal different from the first through hole. Through the disposition of the second through hole, the transmission direction of the signal may be controlled and/or the directivity of the electronic component may be improved without substantially affecting the frequency response of the electronic device.

Finally, it should be noted that the above embodiments are only used to illustrate, but not to limit, the technical solution of the disclosure. Although the disclosure has been described in detail with reference to the above embodiments, persons skilled in the art should understand that the technical solutions described in the above embodiments may still be modified or some or all of the technical features thereof may be equivalently replaced. However, these modifications or replacements do not cause the essence of the corresponding technical solutions depart from the scope of the technical solutions of the embodiments of the disclosure. As long as the features of the various embodiments do not violate the spirit of the disclosure or conflict with each other, the features of the various embodiments may be mixed and matched arbitrarily.

What is claimed is:

1. An electronic device, comprising:
    a substrate; and
    a plurality of subunits, bonded to the substrate through an adhesive layer, and at least one of the plurality of subunits comprising:
        a glass substrate, comprising a first surface, a second surface corresponding to the first surface, and at least two first through holes, wherein the first through hole comprises a third surface, and the third surface is connected to the first surface and the second surface;
        a first conductive layer, disposed on the first surface;
        a second conductive layer, disposed on the second surface; and
        a third conductive layer, disposed on the third surface, and electrically connected to the first conductive layer and the second conductive layer,
        wherein the first through hole has a major axis and a minor axis in a top view direction.

2. The electronic device according to claim 1, wherein the at least two first through holes are respectively disposed on two sides of the glass substrate corresponding to each other so as to form a waveguide.

3. The electronic device according to claim 1, wherein the glass substrate further comprises at least one second through hole, the second through hole is adjacent to the first through hole, and the second through hole and the first through hole transmit different signals.

4. The electronic device according to claim 3, further comprising an electronic component, wherein the electronic component is disposed on the glass substrate, and the electronic component receives a DC signal through the second through hole.

5. The electronic device according to claim 3, wherein the second through hole is disposed between the two first through holes in a first direction.

6. The electronic device according to claim 3, wherein the second through hole is disposed on an edge of the first surface and an edge of the second surface.

7. The electronic device according to claim 1, wherein the first through hole comprises a closed shape.

8. The electronic device according to claim 1, wherein the first through hole is disposed on an edge of the first surface and an edge of the second surface.

9. A method of manufacturing an electronic device, comprising:
    providing a glass substrate, wherein the glass substrate comprises a first surface and a second surface corresponding to the first surface;
    patterning the glass substrate to form at least two first through holes, wherein a third surface is formed in the glass substrate by the first through hole, and the third surface is connected to the first surface and the second surface;
    forming a first conductive layer on the first surface;
    forming a second conductive layer on the second surface; and
    forming a third conductive layer on the third surface, such that the third conductive layer is electrically connected to the first conductive layer and the second conductive layer,
    wherein the first through hole has a major axis and a minor axis in a top view direction, wherein the method further comprises:
provising another substrate;
forming a first adhesive layer on the another substrate;
cutting the glass substrate to form a plurality of subunits; and
bonding the plurality of subunits to the another substrate through the first adhesive layer.

10. The method of manufacturing the electronic device according to claim 9, wherein the at least two first through holes are respectively formed on two sides of the glass substrate corresponding to each other so as to form a waveguide.

11. The method of manufacturing the electronic device according to claim 9, further comprising patterning the glass substrate to form at least one second through hole different from the first through hole, wherein the second through hole is used to transmit a DC signal.

12. The method of manufacturing the electronic device according to claim 11, wherein the second through hole is disposed between the two first through holes in a first direction.

13. The method of manufacturing the electronic device according to claim 11, wherein the second through hole is disposed on an edge of the first surface and an edge of the second surface.

14. The method of manufacturing the electronic device according to claim 9, wherein the step of forming the first conductive layer on the first surface comprises a patterning process.

15. The method of manufacturing the electronic device according to claim 9, wherein the step of forming the second conductive layer on the second surface comprises a patterning process.

16. The method of manufacturing the electronic device according to claim 9, wherein the first through hole is formed in a closed shape or formed on an edge of the first surface and an edge of the second surface.

17. The method of manufacturing the electronic device according to claim 9, further comprising:
forming a second adhesive layer between at least two of the plurality of subunits; and
bonding the at least two of the plurality of subunits through the second adhesive layer.

* * * * *